United States Patent
Purchase et al.

(10) Patent No.: US 12,420,543 B2
(45) Date of Patent: Sep. 23, 2025

(54) TRANSFER PRINTING STAMPS AND METHODS OF STAMP DELAMINATION

(71) Applicant: X-Celeprint Limited, Dublin (IE)

(72) Inventors: Ken G. Purchase, Morrisville, NC (US); Ronald S. Cok, Rochester, NY (US)

(73) Assignee: X-Celeprint Limited, Dublin (IE)

(*) Notice: Subject to any disclaimer, the term of this patent is extended or adjusted under 35 U.S.C. 154(b) by 0 days.

(21) Appl. No.: 17/886,985

(22) Filed: Aug. 12, 2022

(65) Prior Publication Data

US 2023/0059174 A1 Feb. 23, 2023

Related U.S. Application Data

(60) Provisional application No. 63/233,946, filed on Aug. 17, 2021.

(51) Int. Cl.
  *B41F 16/00* (2006.01)
  *B41K 3/02* (2006.01)
  *H01L 23/00* (2006.01)

(52) U.S. Cl.
  CPC ...... *B41F 16/0053* (2013.01); *B41F 16/0073* (2013.01); *B41K 3/02* (2013.01); *H01L 24/97* (2013.01)

(58) Field of Classification Search
  CPC .... B41F 16/0053; B41F 16/0073; B41K 3/02; H01L 24/97
  See application file for complete search history.

(56) References Cited

U.S. PATENT DOCUMENTS

| | | | |
|---|---|---|---|
| 7,195,733 B2 * | 3/2007 | Rogers | G03F 7/0002 |
| | | | 264/496 |
| 7,622,367 B1 | 11/2009 | Nuzzo et al. | |
| 7,927,976 B2 | 4/2011 | Menard | |
| 7,943,491 B2 | 5/2011 | Nuzzo et al. | |
| 8,506,867 B2 | 8/2013 | Menard | |
| 8,889,485 B2 | 11/2014 | Bower | |

(Continued)

FOREIGN PATENT DOCUMENTS

EP 4171933 * 6/2021

OTHER PUBLICATIONS

Hamer et al., 63.2: AMOLED Displays Using Transfer-Printed Integrated Circuits, SID 09 DIGEST, 40(2):947-950 (2009).

*Primary Examiner* — Christopher E Mahoney
*Assistant Examiner* — Marissa Ferguson-Samreth
(74) *Attorney, Agent, or Firm* — Choate, Hall & Stewart LLP; Michael D. Schmitt

(57) ABSTRACT

A stamp for micro-transfer printing includes a support having a support surface and posts disposed on the support surface. Each post has a distal end extending away from the support. The post has a post surface on the distal end. The post surface is a structured surface comprising spatially separated ridges that extend in a ridge direction entirely across the post surface and can be operable to form multiple delamination fronts when a first side of a micro-device is in contact with the post surface, a second side of the micro-device is in contact with a target surface of a target substrate, and the support is moved in a horizontal direction parallel to the target substrate surface. The post surface or ridges can be rectangular or non-rectangular with opposing edges having different lengths.

21 Claims, 13 Drawing Sheets

(56) References Cited

U.S. PATENT DOCUMENTS

| | | |
|---|---|---|
| 9,238,309 B2 | 1/2016 | King et al. |
| 9,412,727 B2 | 8/2016 | Menard et al. |
| 9,704,821 B2 | 7/2017 | Meitl et al. |
| 10,222,698 B2 | 3/2019 | Prevatte et al. |
| 10,575,667 B2 | 3/2020 | Hulseman et al. |
| 10,899,067 B2 | 1/2021 | Moore et al. |
| 11,062,936 B1 | 7/2021 | Moore et al. |
| 11,145,788 B2 | 10/2021 | Ahn et al. |
| 2017/0047306 A1 | 2/2017 | Meitl et al. |
| 2017/0133250 A1* | 5/2017 | Menard ............... B81C 1/00373 |
| 2021/0039380 A1* | 2/2021 | Cok ................... B41F 16/0046 |
| 2021/0193500 A1* | 6/2021 | Moore .............. H01L 21/67706 |
| 2021/0300098 A1* | 9/2021 | Moore .................... B41K 3/04 |
| 2021/0336114 A1* | 10/2021 | Bower .................... H01L 24/97 |
| 2023/0197479 A1 | 6/2023 | Benkendorfer et al. |
| 2024/0038570 A1 | 2/2024 | Purchase et al. |
| 2024/0231017 A1 | 7/2024 | Cok |

* cited by examiner

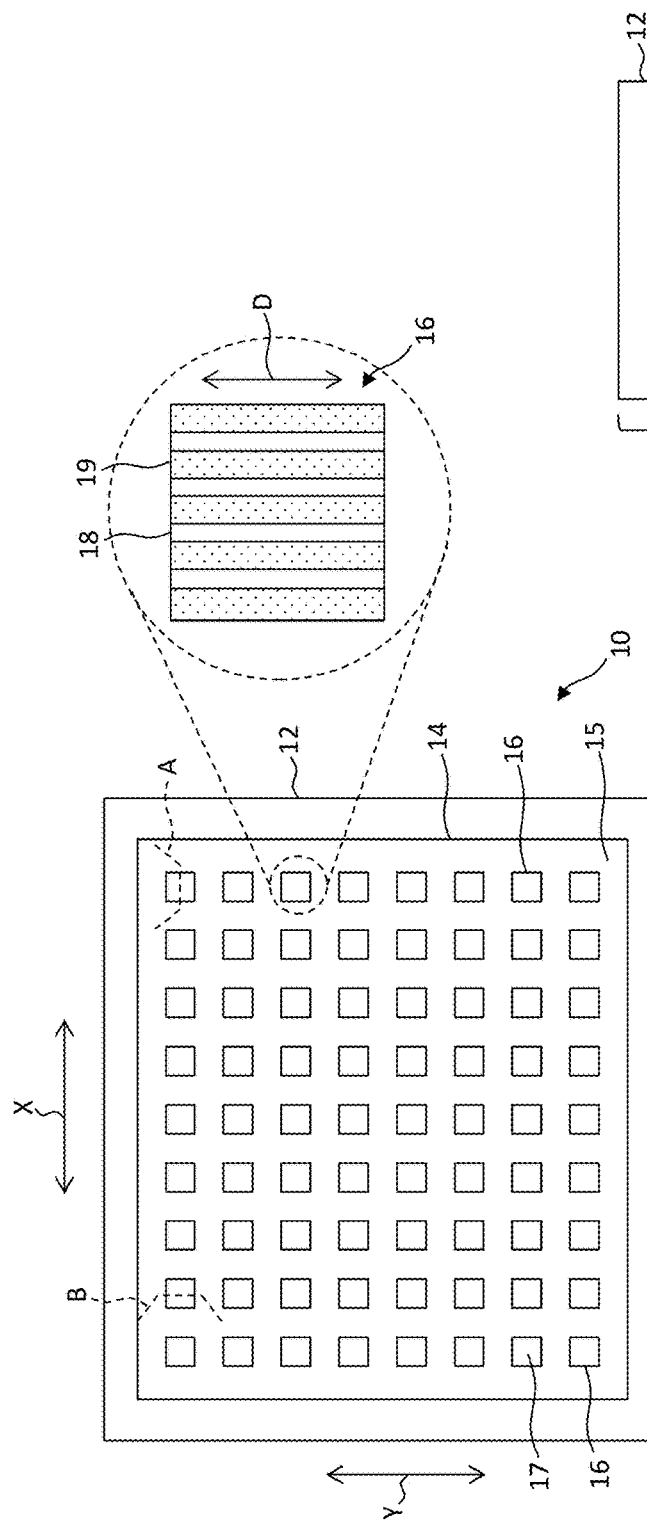
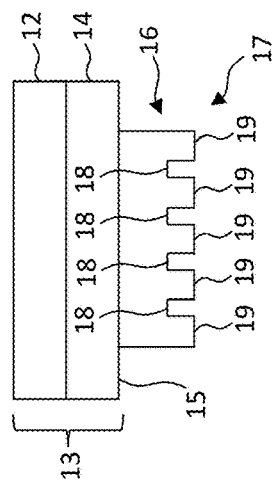
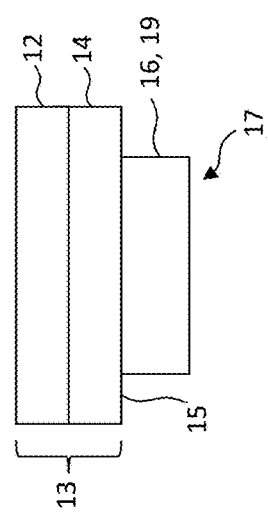
FIG. 1B
FIG. 1C
FIG. 1D

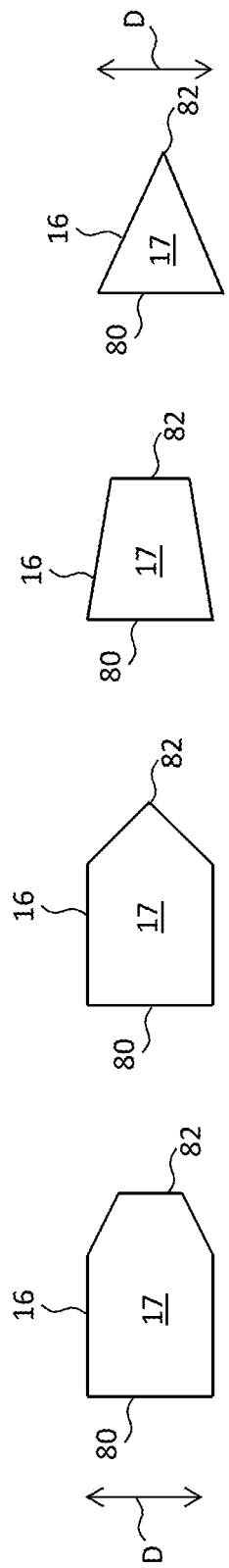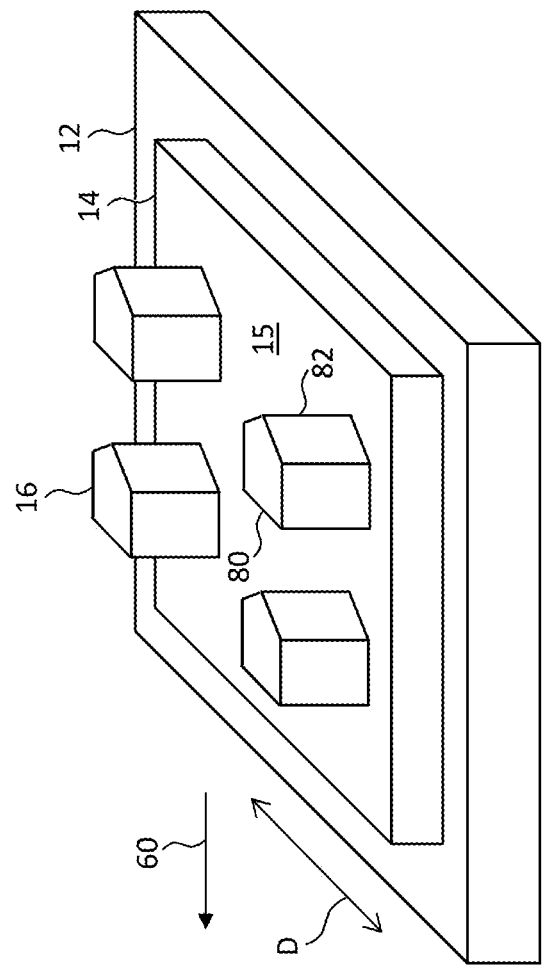

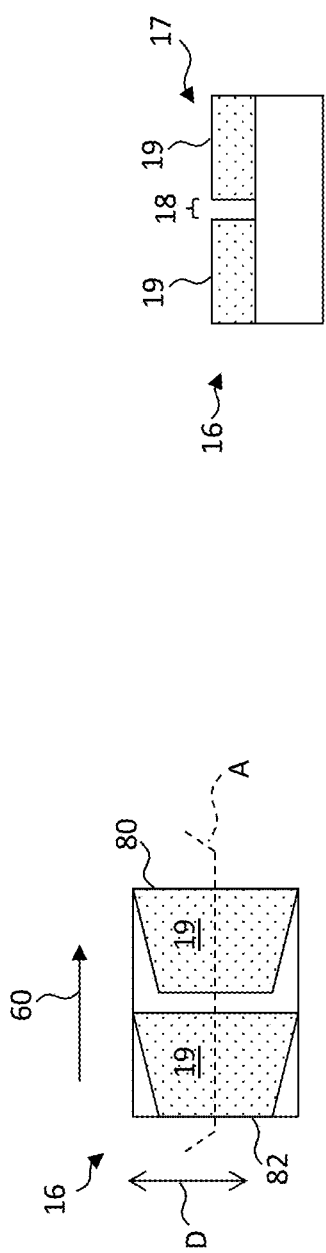
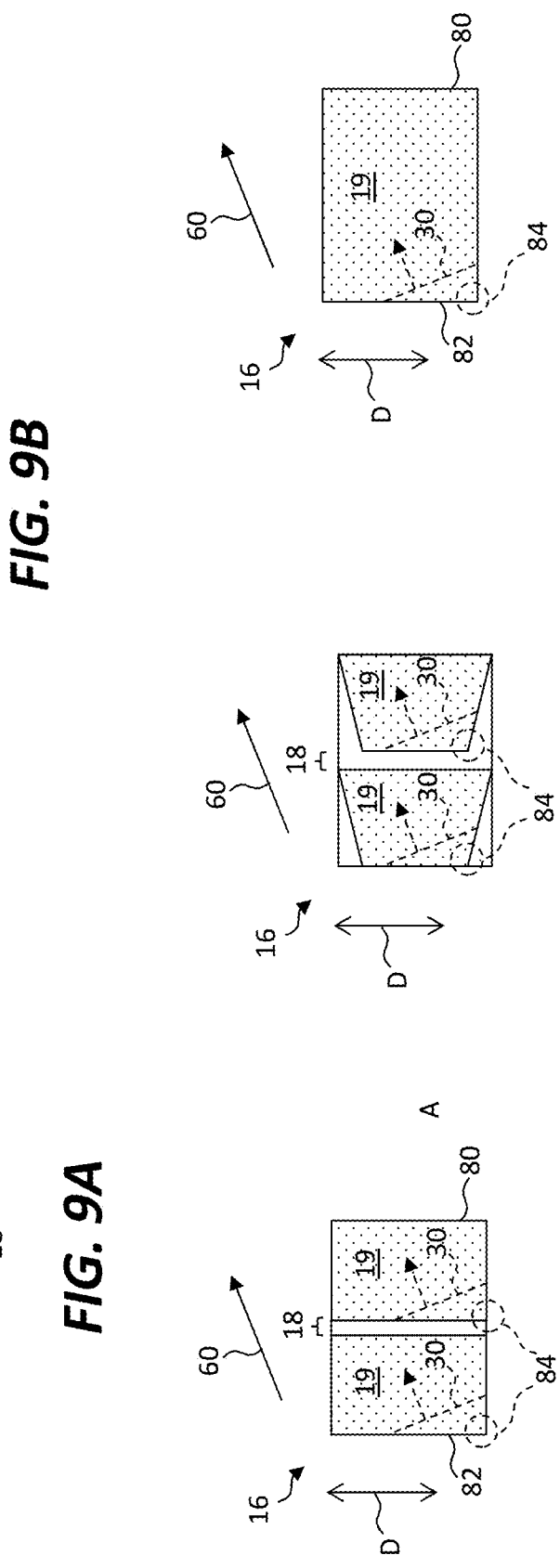

TRANSFER PRINTING STAMPS AND METHODS OF STAMP DELAMINATION

PRIORITY APPLICATION

The present application claims the benefit of U.S. Provisional Patent Application No. 63/233,946, filed on Aug. 17, 2021, the disclosure of which is hereby incorporated by reference herein in its entirety.

TECHNICAL FIELD

The present disclosure relates to stamps used in micro-transfer printing.

BACKGROUND

Conventional methods for applying integrated circuits to a destination substrate, such as pick-and-place, are limited to relatively large devices, for example having a dimension of a millimeter or more. It is often difficult to pick up and place ultra-thin, fragile, or small micro-devices using such conventional technologies. More recently, micro-transfer printing methods have been developed that permit the selection and application of these ultra-thin, fragile, or small micro-devices without causing damage to the micro-devices themselves.

Micro-transfer-printing enables deterministically removing arrays of micro-scale, high-performance micro-devices from a native source wafer, typically a semiconductor wafer on which the micro-devices are constructed and assembling and integrating the micro-devices onto non-native target (destination) substrates. Embodiments of micro-transfer-printing processes leverage engineered elastomer stamps coupled with high-precision motion-controlled print-heads to selectively pick-up and print large arrays of micro-scale devices from a source native wafer onto non-native target substrates.

Adhesion between an elastomer transfer device (e.g., stamp) and a printable element can be selectively tuned by varying the speed of the print-head on which the stamp is mounted. This rate-dependent adhesion is a consequence of the viscoelastic nature of the elastomer used to construct the stamp. When the stamp is moved quickly away from a bonded interface, the adhesion is large enough to "pick" the printable elements away from their native substrates, and conversely, when the stamp is moved slowly away from a bonded interface the adhesion is low enough to "let go" or "print" the element onto a foreign, non-native surface. This process may be performed in massively parallel operations in which the stamps can transfer, for example, hundreds to thousands of discrete structures in a single pick-up and print operation. Element printing can be enhanced by using shear offset between the stamp and the target substrate, for example as described in U.S. Pat. No. 8,506,867, whose contents are incorporated by reference herein.

Micro-structured stamps may be used to pick up micro-devices from a source wafer, transport the micro-devices to the target substrate, and print the micro-devices onto the target substrate. The transfer device (e.g., micro-structured stamp) can be made using various materials. Posts on the transfer device can be constructed to pick up material from a pick-able object and then print the material to the target substrate. The posts can be generated in an array fashion and can have a range of heights depending on the size of the printable material. Embodiments of micro-transfer printing stamps are described, for example, in U.S. Pat. Nos. 8,506,867, 7,943,491, 9,412,727, 7,195,733 and 9,704,821.

Micro-transfer printing enables parallel assembly of high-performance semiconductor micro-devices onto virtually any substrate material, including glass, plastics, metals, or semiconductors. The substrates may be flexible, thereby permitting the production of flexible systems. Flexible substrates may be integrated in a large number of configurations, including configurations not possible with brittle silicon-based electronic micro-micro-devices. Additionally, plastic substrates, for example, are mechanically rugged and may be used to provide electronic, opto-electronic, or photonic systems that are less susceptible to damage or performance degradation caused by mechanical stress. Moreover, micro-transfer printing techniques can print semiconductor micro-devices at temperatures compatible with assembly on plastic polymer substrates. Thus, these materials may be used to fabricate electronic, opto-electronic, or photonic systems by continuous, high-speed, printing techniques capable of disposing electronic, opto-electronic, or photonic micro-devices over large substrate areas at low cost (e.g., roll-to-roll manufacturing).

In some applications, in particular photonic or opto-electronic systems, alignment between printed micro-devices on a target substrate or between a printed micro-device and a structure on a target substrate is important. Moreover, it is important to print with a high yield to reduce manufacturing costs. There is a need, therefore, for stamps having an improved accuracy and yield in printing micro-devices on a target substrate.

SUMMARY

The present disclosure provides, inter alia, structures and methods that enable micro-transfer printing for micro-devices provided on a source wafer. The micro-devices on the source wafer are contacted by a stamp to adhere the micro-devices to the stamp and release them from the source wafer. The micro-devices are then pressed against a target (or destination) substrate to adhere the micro-devices to the target substrate. The stamp is moved away from the target substrate, leaving the micro-devices on the target substrate. In some embodiments, an adhesive layer is disposed on the target substrate to enhance adhesion between the micro-devices and the target substrate. In some embodiments, no adhesive layer is disposed on the target substrate and the micro-devices are adhered directly to the target substrate. The present disclosure provides, among other things, stamps used for micro-transfer printing that have an improved accuracy and yield in printing micro-devices to a desired location on a non-native target substrate with or without an adhesive layer disposed on the target substrate.

According to embodiments of the present disclosure, a stamp for micro-transfer printing comprises a support having a support surface and posts disposed on the support surface, each of the posts comprising and a distal end extending away from the support, the post having a post surface on the distal end. The post surface can be a structured surface comprising spatially separated ridges that extend in a ridge direction entirely across the post surface. The ridges can be separated by grooves that extend in the ridge direction entirely across the post surface [e.g., wherein area of the ridges is greater than area of the grooves (e.g., at least twice, at least four times, at least six times, or at least eight times greater)]. The grooves can have a rectangular cross section in a direction that is orthogonal to the ridge direction and to the support surface. The grooves can have a triangular cross section in a direction that is orthogonal to the ridge direction and to the support surface. The ridges can have a rectangular or trapezoidal cross section in a direction that is orthogonal to the ridge direction and to the support surface. The ridges can have a triangular cross section in a direction that is orthogonal to the ridge direction and to the support surface. Each of the ridges can have a same shape, some of the ridges can have a shape different from others of the ridges, or a surface of the ridges can have a rectangular shape or forms a line. In some embodiments, the ridges have a first end and an opposing second end in a direction that is orthogonal to the ridge direction and parallel to the support surface, and the first end has a length that is different from a length of the second end.

According to embodiments of the present disclosure, the support or a layer of the support and the posts can comprise polydimethylsiloxane. At least a portion of the support and the posts can be a common structure (e.g., formed in a single molding step).

According to embodiments of the present disclosure, a stamp for micro-transfer printing can comprise a support having a support surface and posts disposed on the support surface. Each of the posts can comprise a distal end extending away from the support and a post surface on the distal end. A proximal end of the post can be in contact with or supported by the support. The post surface can be a surface structured such that, when the post surface is being separated from a component temporarily adhered to the surface, multiple delamination fronts are formed at the post surface. The post surface can be structured such that the multiple delamination fronts are formed when separation is performed while the component is at least partially in contact with a target surface of a target substrate. The post surface can be structured such that the multiple delamination fronts are formed when the support is moved at least partially in a horizontal direction.

According to embodiments of the present disclosure, a stamp for micro-transfer printing comprises a support having a support surface and posts disposed on the support surface. Each of the posts can comprise a distal end extending away from the support and a post surface on the distal end. The post surface can be non-rectangular and can have opposing edges with different lengths. In some embodiments, the post surface is triangular or trapezoidal or has an edge that is triangular or trapezoidal.

According to embodiments of the present disclosure, a stamp for micro-transfer printing comprises a support having a support surface and posts disposed on the support surface. Each of the posts can comprise a distal end extending away from the support and a post surface on the distal end. The post surface can have a first edge and a second edge and the first edge can be longer than the opposing second edge or point (e.g., the post surface has a triangular, trapezoidal, or house-shaped pentagonal shape). The post surface can be a structured surface comprising spatially separated ridges that extend in a ridge direction entirely across the post surface.

According to embodiments of the present disclosure, a method of micro-transfer printing comprises providing a stamp, a source wafer comprising components (e.g., micro-devices) disposed in an arrangement corresponding to an arrangement of the posts, and a target substrate, contacting the posts to the micro-devices, removing the components from the source wafer, and contacting the components to a substrate surface of the target substrate. Contacting the components to the substrate surface can comprise moving the components toward and in contact with the target substrate, moving the components in a direction parallel to the substrate surface, and moving the stamp away from the target substrate. The direction parallel to the substrate surface can be orthogonal or diagonal to the ridge direction.

A method of micro-transfer printing can comprise providing a stamp comprising posts, components temporarily adhered to the posts, and a target substrate, and separating the stamp from the components to print the components to the target substrate. Separating the stamp can comprise forming multiple delamination fronts for each of the posts.

Contact surfaces of the posts that temporarily adheres the components (e.g., post surfaces) can be structured surfaces comprising spatially separated ridges. Separating the stamp can comprises moving the stamp horizontally relative to the target substrate (e.g., shearing the stamp from the components), moving the stamp vertically, or both.

Methods of the present disclosure can comprise providing a motion-control platform attached to the stamp for controlling the stamp. Contacting the posts to the components, removing the components from the source wafer, and contacting the components to the substrate surface can be performed using the motion-control platform.

Methods of the present disclosure can comprise providing a first stamp and a first side of a micro-device temporarily adhered to each of the posts of the first stamp, providing a second stamp, the second stamp comprising a support having a support surface and posts disposed on the support surface, each of the posts comprising a distal end extending away from the support, the post having a post surface on the distal end, providing a motion-control platform attached to the first stamp or the second stamp, and using the motion-control platform to contact and adhere the posts of the second stamp to a second side of the micro-devices opposite the first side and remove the micro-devices from the first stamp. Removing the micro-devices from the first stamp can comprise moving the first stamp relative to the second stamp in a direction at least partially orthogonal to the ridge direction, at least partially orthogonal to the delamination fronts, or at least partially in a direction orthogonal to one of the opposing sides. The second stamp can be a stamp having a structured distal end and the second stamp can be rotated with respect to the first stamp. The direction parallel to the substrate surface can be orthogonal or diagonal to the ridge direction of the first stamp.

Methods of the present disclosure can comprise providing a first stamp comprising posts, components temporarily adhered to the posts of the first stamp, and a second stamp comprising posts, and separating the first stamp from the components to transfer the components to the posts of the second stamp, wherein separating the stamp comprises forming multiple delamination fronts for each of the posts of the first stamp. Contact surfaces of the posts of the first stamp that temporarily adheres the components (e.g., post surfaces) can be structured surfaces comprising spatially separated ridges. Separating the stamp can comprise moving the first stamp horizontally relative to the second stamp (e.g., shearing the first stamp from the components). The posts of the second stamp can have unstructured (e.g., flat) surfaces or can have structured surface having spatially separated ridges aligned in a different direction from spatially separated ridges comprised in structure surfaces of the posts of the first stamp (e.g., aligned orthogonally to each other). Methods of the present disclosure can comprise printing the components to a target substrate from the second stamp.

Methods of the present disclosure can comprise providing a stamp comprising a support having a support surface and posts disposed on the support surface, each of the posts comprising a distal end extending away from the support, the post having a post surface on the distal end, the post surface having edges and corners, and a micro-device temporarily adhered to each post surface, providing a target substrate having a target substrate surface, providing a motion-control platform attached to the stamp, and using the motion-control platform to contact the micro-devices to the target substrate surface. Contacting the micro-devices to the target substrate surface can comprise moving the micro-devices toward and in contact with the target substrate surface, moving the micro-devices in a direction parallel to the target substrate surface at least partially in a direction non-parallel to one of the edges, and moving the stamp away from the target substrate. The post surface can be a structured surface comprising spatially separated ridges that extend in a ridge direction entirely across the post surface and the direction parallel to the substrate surface can be orthogonal, diagonal, or diagonally at 45 degrees with respect to the ridge direction.

Methods of the present disclosure can comprise providing a stamp comprising posts, components temporarily adhered to the posts of the stamp, and a target substrate, and separating the stamp from the components to print the components to the target substrate. The posts can have a post surface to which the components are temporarily adhered. The post surface can comprise edges and corners and separating the stamp can comprise moving the stamp in a direction non-parallel to one of the edges.

Methods of the present disclosure can comprise providing a first stamp comprising posts, providing components temporarily adhered to the posts of the first stamp, providing a second stamp comprising posts, and separating the first stamp from the components to transfer the components to the posts of the second stamp, wherein the posts of the first stamp have a post surface to which the components are temporarily adhered, the post surface comprises edges and corners, and separating the first stamp comprises moving the first stamp in a direction non-parallel to one of the edges.

Embodiments of the present disclosure provide stamps with improved print yields and accuracy.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1B is a bottom plan view of a micro-transfer printing stamp with a detail view of a micro-transfer printing stamp post surface, FIG. 1C is a cross section taken along cross section line A of a micro-transfer printing stamp post of FIG. 1B, and FIG. 1D is a cross section taken along cross section line B of a micro-transfer printing stamp post of FIG. 1B according to illustrative embodiments of the present disclosure;

FIG. 4A shows a printing system with a motion platform and stamp with stamp posts in contact with micro-devices on a source wafer with a detail of a stamp post and micro-device, FIG. 4B shows micro-devices adhered to stamp posts removed from the source wafer, FIG. 4C shows micro-devices adhered to stamp posts in contact with a target substrate, FIG. 4D shows horizontal shear offset between the stamp and the target substrate, FIG. 4E shows the stamp removed from and the micro-devices adhered to the target substrate;

FIG. 8A is a perspective of a stamp with posts and FIGS. 8B-8E are plan views of stamp posts having different post surface shapes with different-length opposing sides according to illustrative embodiments of the present disclosure;

FIG. 9A is a plan view and FIG. 9B is a corresponding cross section taken across cross section line A of a stamp post having ridges with different-length opposing sides according to illustrative embodiments of the present disclosure; and FIGS. 10A-10C are plan views of stamp posts according to illustrative embodiments of the present disclosure.

Figure 1A:
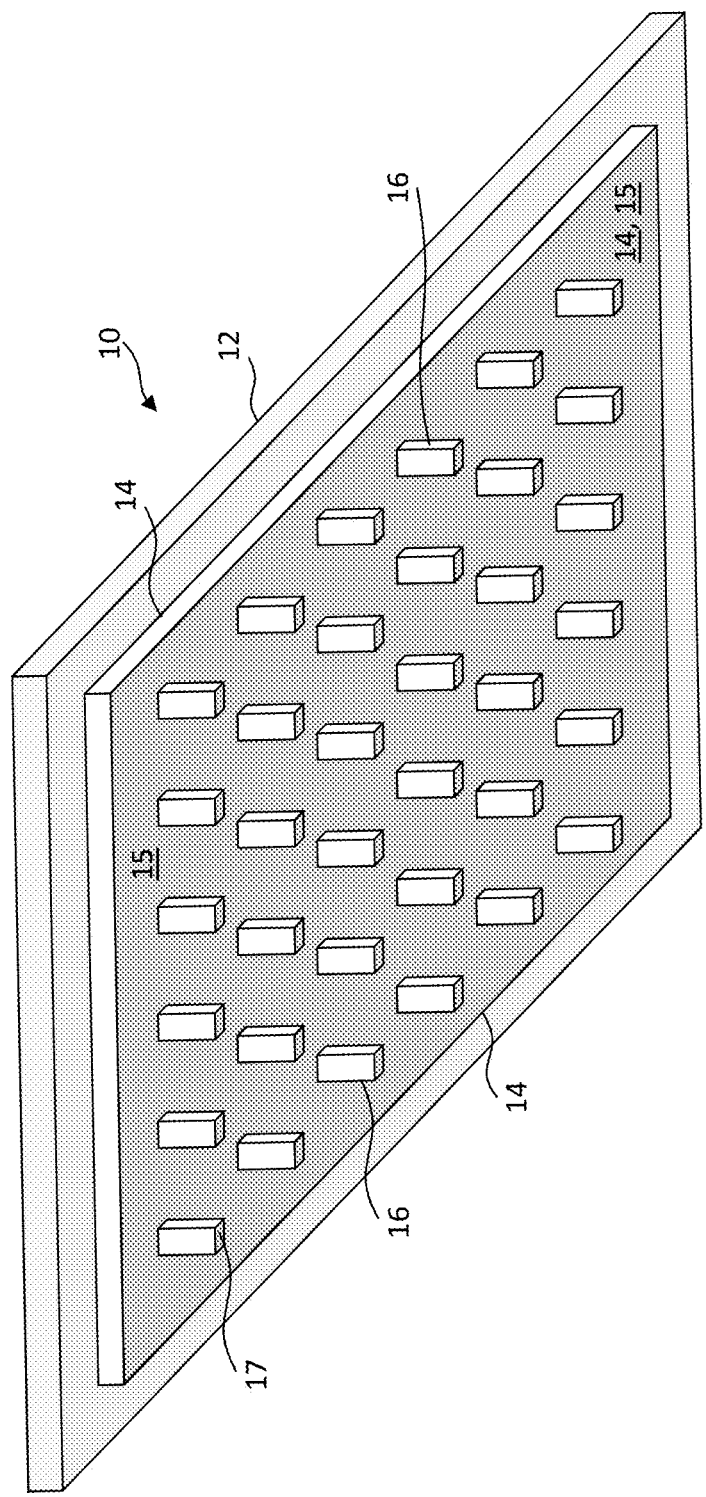
FIG. 1A is a perspective of the bottom side of a micro-transfer printing stamp.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, or structurally similar elements. The figures are not drawn to scale since the variation in size of various elements in the Figures is too great to permit depiction to scale.

DETAILED DESCRIPTION OF CERTAIN EMBODIMENTS

The present disclosure provides, inter alia, structures and methods that enable micro-transfer printing for micro-devices (chiplets) provided on a source wafer. The terms "micro-device" and "chiplet" are used interchangeably and have the same meaning herein. Generally, the following description refers to printing "micro-devices" as an example of printing components, which can be micro-devices or can be not micro-devices, for example a mass of material (e.g., seed crystal or piezoelectric material) or a passive electronic component (e.g., jumper). The micro-devices are formed on the source wafer, released from the source wafer, contacted by a stamp to adhere the micro-devices to the stamp, removed from the source wafer, and pressed against a target (or destination) substrate to adhere the micro-devices to the target substrate. The stamp is then moved away from the target substrate, leaving the micro-devices adhered to the target substrate. The micro-devices can be disposed on the target substrate with improved accuracy and yield. In some embodiments, an adhesive layer is disposed on the target substrate to enhance adhesion between the micro-devices and the target substrate. In some embodiments, no adhesive layer is disposed on the target substrate and the micro-devices are adhered directly to the target substrate. The present disclosure provides, among other things, stamps used for micro-transfer printing that have an improved accuracy and yield in printing micro-devices to a desired location on a non-native target substrate with or without an adhesive layer disposed on the target substrate.

Materials used in micro-transfer printing stamps can comprise visco-elastic and elastomeric materials such as polydimethylsiloxane (PDMS). As shown in FIG. 1A, a stamp 10 typically includes a rigid support 12 and, optionally, a body from which a post 16 (sometimes called a pillar) extends. Each post 16 is used to contact a single component 20 (e.g., micro-device 20) (shown in FIG. 4A, discussed below) or micro-structure such as a chiplet 20, and each micro-device 20 is contacted by a single post 16 to perform a release and print of micro-device 20 from a source wafer 50 (shown in FIG. 4A, discussed below) to a non-native target substrate 40 (shown in FIG. 4C, discussed below). According to some embodiments, the optional body of stamp 10 comprises a mesa 14 or pedestal disposed on rigid support 12 and posts 16 extend from mesa 14. In some embodiments, posts 16 extend directly from rigid support 12 or stamp 10 comprises multiple separate mesas 14 from each of which posts 16 extend. Rigid support 12 and any one or more mesas 14, or stamp body, form a support 13 having a support surface 15 on which posts 16 are disposed and from which posts 16 extend. In some embodiments, support 13 does not comprise a rigid support 12. As shown in FIGS. 1B-1D, posts 16 comprise a proximal end in contact with support 13 and a distal end extending away from support 13 and support surface 15. Post 16 has a post surface 17 on the distal end. According to some embodiments of the present disclosure and as discussed below with respect to FIGS. 6A-6E, post 16 has a non-rectangular cross section parallel to support surface 15 and post surface 17 is non-structured and substantially planar.

According to some embodiments of the present disclosure and as illustrated in FIGS. 1B and 1C, post 16 can have a rectangular cross section parallel to support surface 15 and post surface 17 is non-planar and has a structured surface comprising spatially separated ridges 19 that extend in a ridge direction D entirely across post surface 17. Post surface 17 has opposing sides or edges and ridges 19 extend from one side (or edge) of post surface 17 to an opposite side (or edge) of post surface 17. For example, ridges 19 can be separated by grooves 18 that likewise extend entirely and all of the way across post surface 17 so that both ridges 19 and grooves 18 contact an edge or side of post 16 and post surface 17 at two or more spatially separate locations. For example, if post 16 has a rectangular cross section parallel to support surface 15 with parallel opposing sides, ridges 19 extend from one side to the parallel opposing side of post surface 17. However, posts 16 are not limited to structures with rectangular cross sections and can have, for example, a quadrilateral or other polygonal cross section. Ridges 19 can extend from one side (or edge) of post surface 17 to another, different side (or edge) of post surface 17, for example a different side parallel to the one side.

FIG. 1A is a perspective bottom view of stamp 10 having a rigid support 12 with a mesa 14 disposed on rigid support 12. Rigid support 12 can comprise, for example glass. Posts 16 are disposed on mesa 14 and extend away from mesa 14 and rigid support 12, for example in a direction orthogonal to a surface of mesa 14. Mesa 14 (and optionally rigid support 12, or vice versa) provides a support 13 having a support surface 15 on which posts 16 are disposed and from which posts 16 extend. Mesa 14 (if present) and posts 16 can comprise a common material, for example polydimethylsiloxane (PDMS), that has a greater coefficient of thermal expansion than rigid support 12. At least a portion of support 13 (e.g., excluding rigid support 12) and posts 16 can be a common structure (e.g., formed in a single molding step). FIG. 1B is a bottom plan view of stamp 10 with posts 16 on mesa 14 and rigid support 12. The FIG. 1B inset illustrates a structured distal end of a post 16 with parallel ridges 19 spatially separated by grooves 18 extending in a ridge direction D across post surface 17. The cross sections of FIGS. 1C and 1D taken across cross section lines A and B, respectively, of FIG. 1B show post surface 17 at the distal end of post 16 with grooves 18 and ridges 19 both with rectangular cross sections taken in a direction orthogonal to ridge direction D and orthogonal to support surface 15.

Figure 3A:
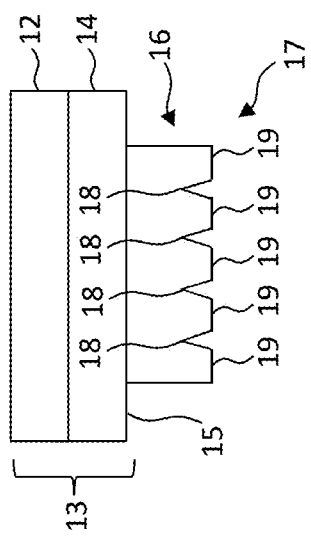
FIGS. 3A and 3B are cross sections of a micro-transfer printing stamp post and post surface according to illustrative embodiments of the present disclosure.
Figure 3B:
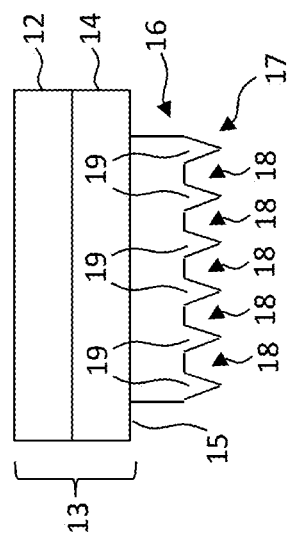
Figure 2:
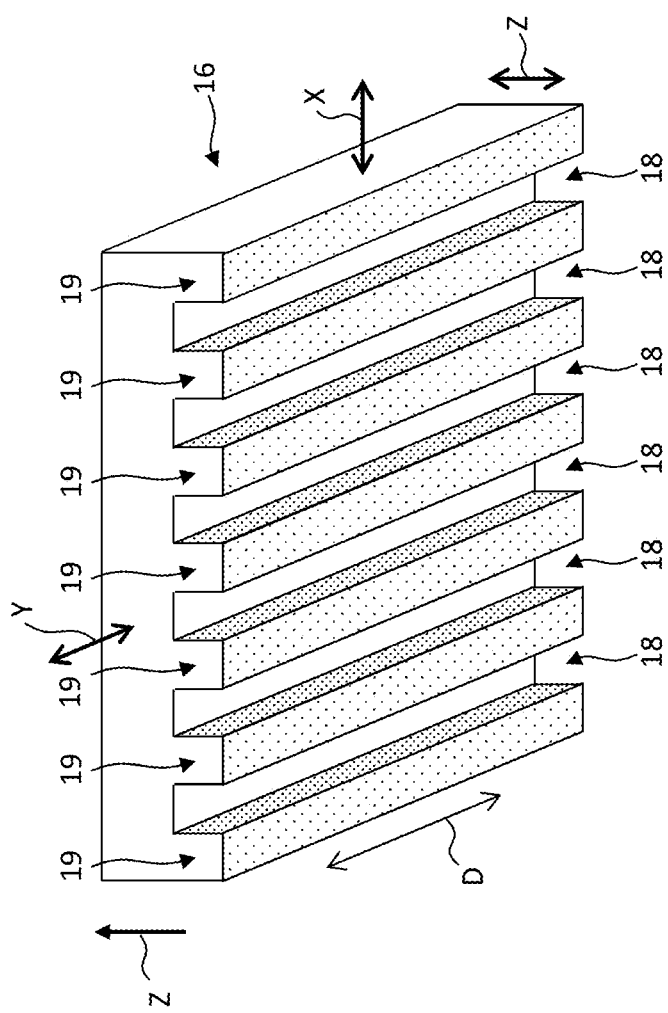
FIG. 2 is a perspective of a micro-transfer printing stamp post and post surface according to illustrative embodiments of the present disclosure.

FIG. 2 is a perspective of the distal end of a post 16 with a post surface 17 structured with rectangular-cross-section ridges 19 and grooves 18. Ridges 19 and grooves 18 extending in ridge direction D are arbitrarily labeled as a direction or dimension Y and the direction or dimension orthogonal to ridge direction D is consequently labeled X. Directions X and Y define a horizontal plane and the vertical direction Z is the direction in which posts 16 extend from support surface 15. FIGS. 3A and 3B illustrate embodiments of the present disclosure in which ridges 19 have a trapezoidal cross section and grooves 18 have a triangular cross section (as shown in FIG. 3A) or ridges 19 have a triangular cross section and grooves 18 have a trapezoidal cross section (as shown in FIG. 3B) cross section spatially separated by grooves 18 with a triangular cross section in a direction orthogonal to ridge direction D and orthogonal to support surface 15. In general, there is no limitation to the cross sectional shapes of ridges 19 or grooves 18. Nor is there a limitation on the shape of ridges 19 on the distal end of post 16. For example, a surface of ridges 19 can have a rectangular shape (e.g., as in FIGS. 2 and 3A) or can form a line (e.g., as in FIG. 3B).

According to some embodiments, all of ridges 19 or grooves 18 have a same shape. In some embodiments, some of ridges 19 or grooves 18 can have different shapes. According to some embodiments, and as discussed further below with respect to FIGS. 6A-6E, ridges 19 can have first and second opposing ends 80, 82 in a direction orthogonal to ridge direction D (e.g., direction X), and first end 80 has a length that is different from a length of second end 82. For example, a distal surface of post 16 can comprise one or more trapezoidal or triangular cross sections.

Figure 4A:
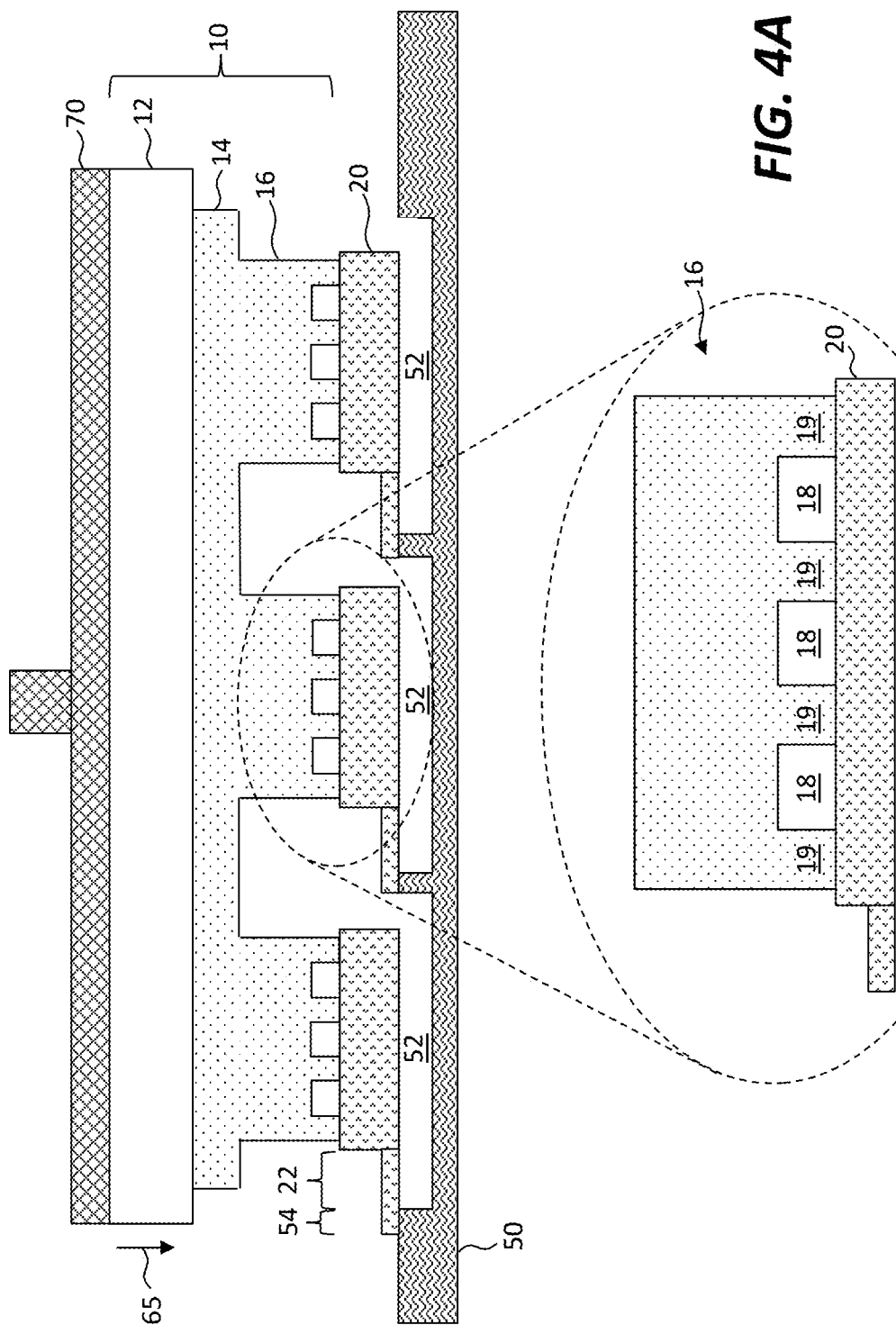
FIGS. 4A-4E are successive cross sections of a method and structures for micro-transfer printing according to illustrative embodiments of the present disclosure, where
Figure 4B:
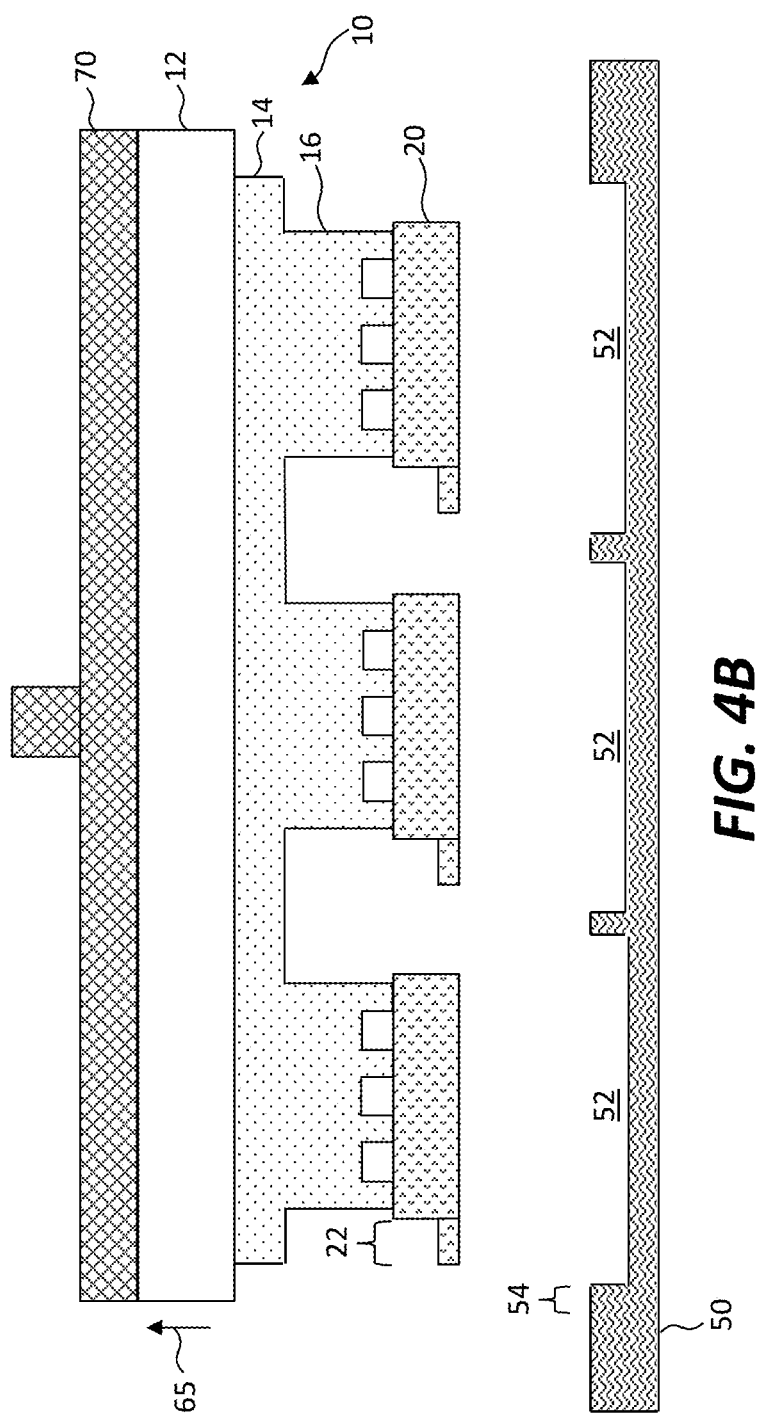
Figure 4C:
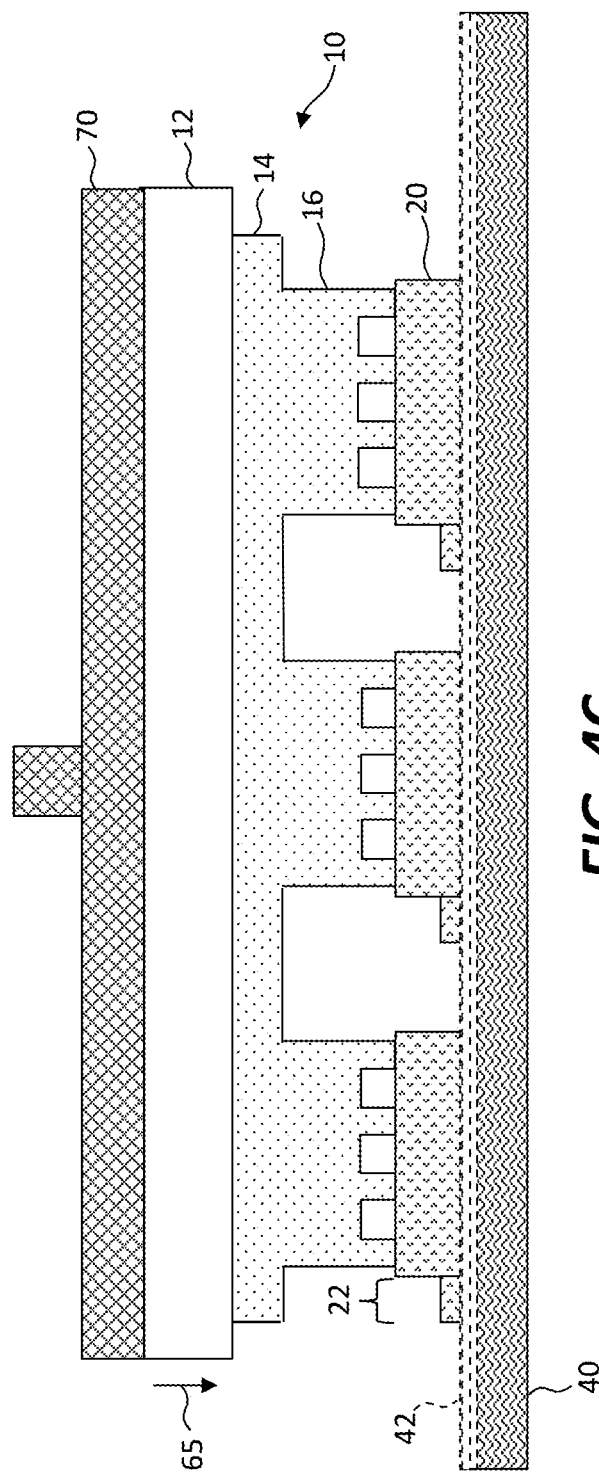
Figure 4D:
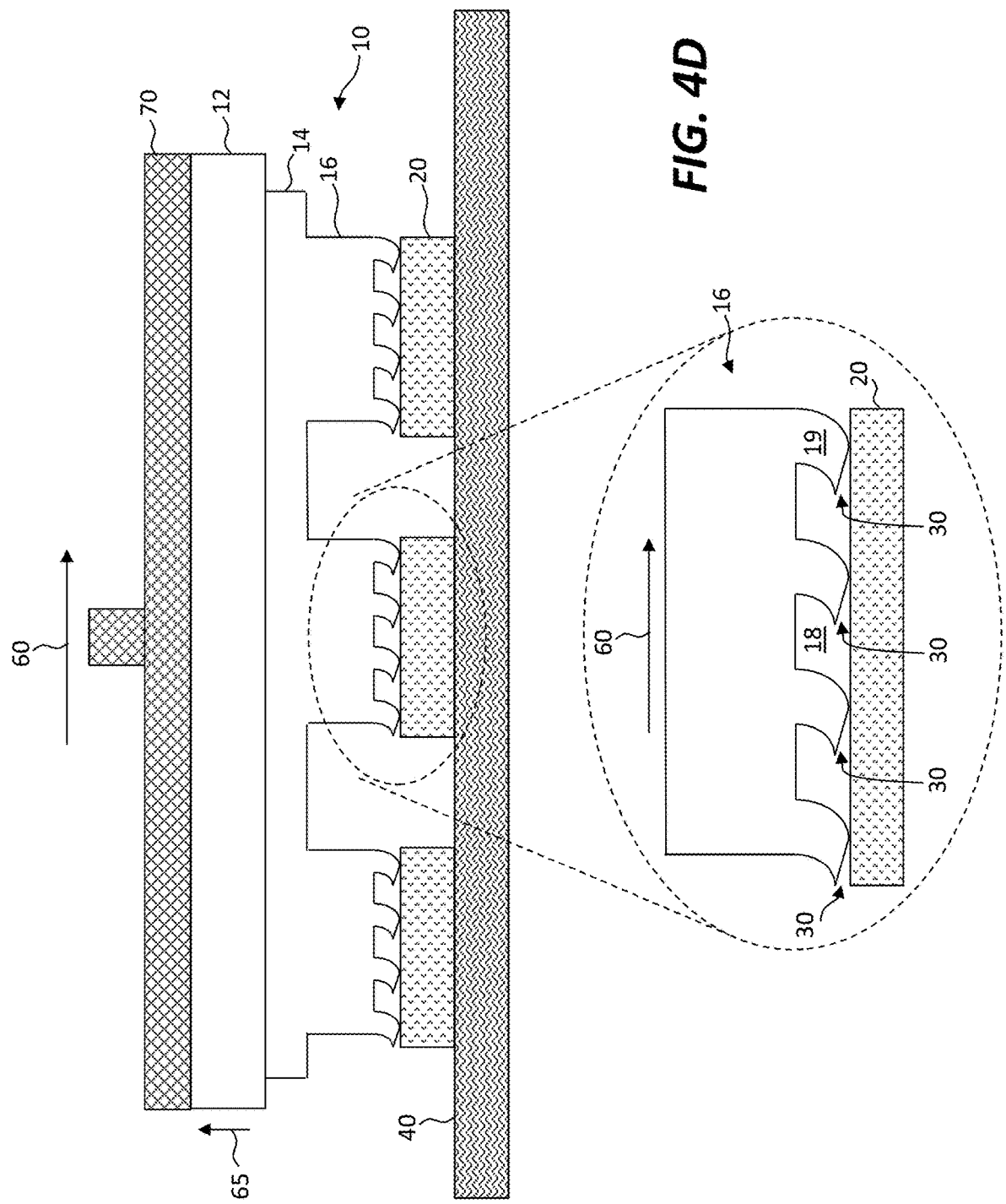
Figure 4E:
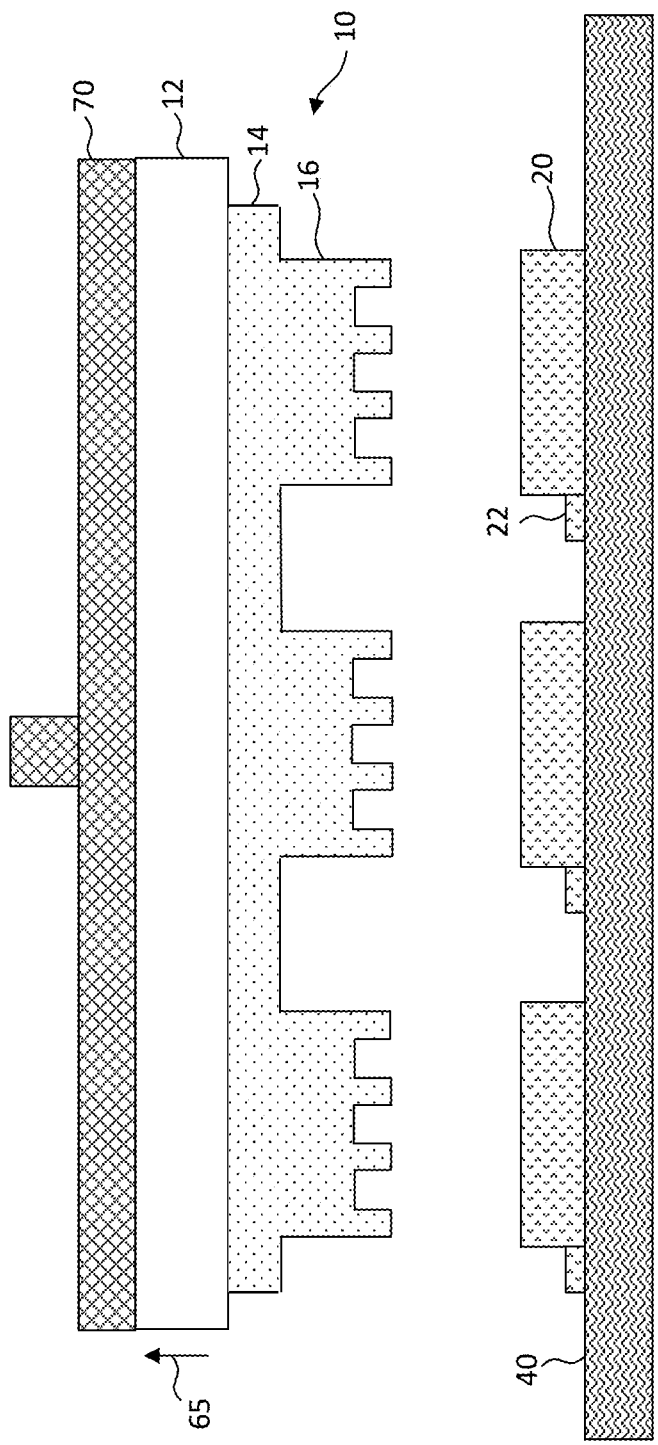
Figure 5:
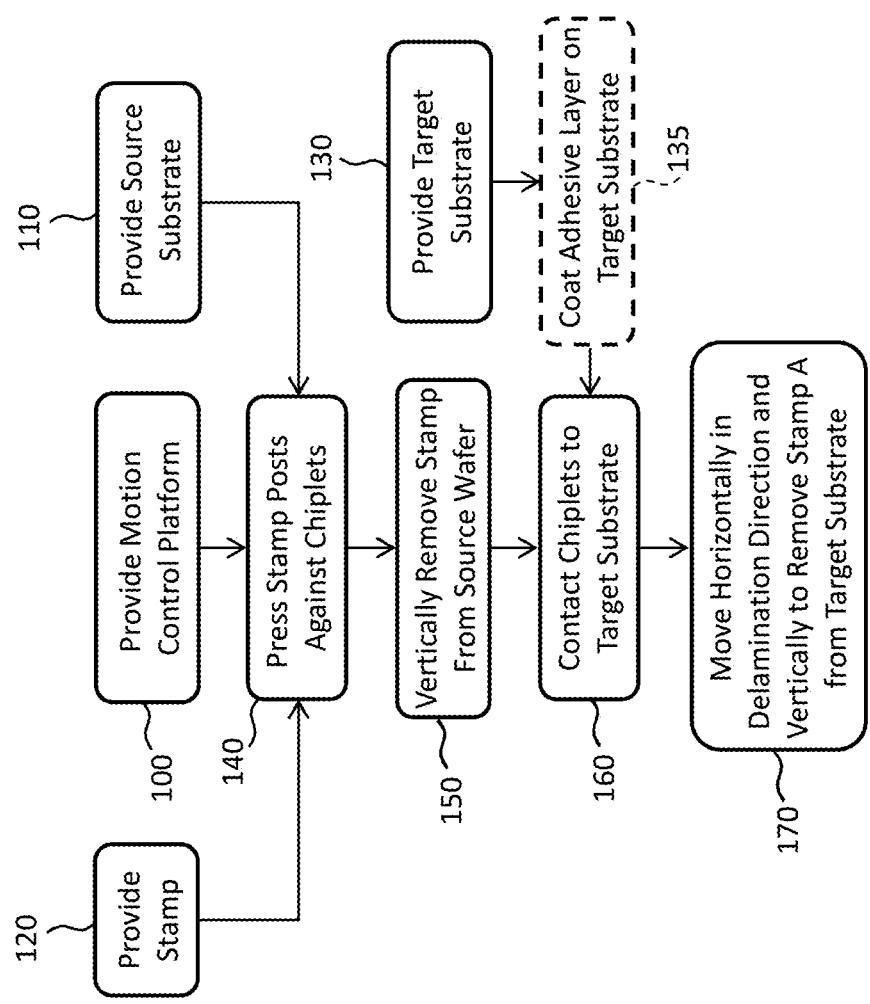
FIG. 5 is a flow diagram of micro-transfer printing from a source wafer to a target substrate according to illustrative embodiments of the present disclosure.

According to embodiments of the present disclosure and as illustrated in the successive cross sections of FIGS. 4A-4E and the flow diagram of FIG. 5, stamps 10 can be used for micro-transfer printing micro-devices 20 (e.g., micro-modules, chiplets, or micro-components) from a source wafer 50 to a target substrate 40 (a destination substrate). A motion-control platform 70 is provided in step 100, a chiplet source wafer 50 (e.g., a source substrate) is provided in step 110, a stamp 10 is provided in step 120, and a target substrate 40 is provided in step 130. As shown in FIG. 4A, chiplet source wafer 50 can comprise a sacrificial layer comprising sacrificial portions 52 separated by anchors 54 attached to chiplets 20 by chiplet tethers 22. Chiplets 20 are disposed directly and entirely over sacrificial portions 52. Chiplets 20 are released from source wafer 50 by etching sacrificial portions 52 to form gaps between chiplets 20 and source wafer 50. Stamp 10 comprising rigid substrate 12, optional mesa 14, and posts 16 with a structured post surface 17 comprising ridges 19 spatially separated by grooves 18 is moved by motion-control platform 70 into position in a vertical direction 65 toward and in alignment with source wafer 50 so that the distal end of posts 16 and at least a portion of ridges 19 contact chiplets 20, temporarily adhering chiplets 20 to posts 16, in step 140 and as shown in FIG. 4A. Motion-control platform 70 then removes stamp 10 from source wafer 50 with chiplets 20 adhered to posts 16 in step 150 by moving stamp 10 in a vertical direction 65 away from source wafer 50 as shown in FIG. 4B, breaking (e.g., fracturing) or separating chiplet tethers 22.

In step 160, motion-control platform 70 moves stamp 10 vertically in direction 65 toward target substrate 40 so that chiplets 20 adhered to posts 16 contact target substrate 40. A layer 42 of adhesive can, but is not necessarily, coated in optional step 135 on target substrate 40 before chiplets 20 are contacted to target substrate 40 (or to adhesive layer 42 if present) as shown in FIG. 4C. Motion-control platform 70 can also move stamp 10 in a horizontal direction 60 (direction X or direction Y or a combination of directions X and Y) parallel to a surface of target substrate 40 in step 160. As used herein, a stamp movement is a relative movement of stamp 10 with respect to a substrate (e.g., target substrate 40) and in some embodiments, the substrate is moved instead of stamp 10 in a direction opposite to the stamp movement. Horizontal can mean substantially horizontal, for example within the tolerance of mechanical motion-control platform 70, for example no greater than ten, no greater than five, no greater than two, or no greater than one degrees of a motion parallel to target substrate 40 surface (an in-plane motion). Horizontal motion can be at any effective rate, for example motion at a rate of 1 mm/s or more. Horizontal motion can be a distance of no less than one, five, ten, twenty, fifty microns, or no greater than one hundred microns.

In step 170 and as shown in FIG. 4D, chiplets 20 adhered to target substrate 40 (and optionally adhesive layer 42) are removed from stamp posts 16. Motion-control platform 70 moves stamp 10 in a horizontal direction 60 parallel to a surface of target substrate 40 and, at the same time, or subsequently, moves stamp 10 in a vertical direction 65 away from target substrate 40. Horizontal motion 60 is at least partially orthogonal to ridge direction D so that the stress of relative horizontal motion 60 between chiplets 20 (adhered to target substrate 40 or adhesive layer 42) and posts 16 causes delamination between ridges 19 on the distal end of posts 16, for example on the trailing edge of posts 16 with respect to the relative stamp 10 motion, separating chiplets 20 from posts 16. Stamp 10 horizontal and vertical movement in steps 160 and 170 can be, but is not necessarily, continuous and can be separate or combined motions. Stamp 10 horizontal and vertical movement in step 170 can be continuous or separate motions and can be combined so that stamp 10 moves both horizontally along and vertically away from target substrate surface at the same time.

The presence of multiple ridges 19 on the distal end of posts 16 causes multiple delamination fronts 30 to form, decreasing the adhesion between chiplets 20 and the distal end of posts 16. A delamination front 30 is the combined area that experiences local delamination at a given time between ridge 19 and chiplet 20 and progresses over time along the surface of chiplet 20 as ridge 19 (and post 16) is peeled from chiplet 20 in a direction substantially parallel to horizontal motion 60. Multiple delamination fronts 30 reduce the adhesion between chiplets 20 and the distal end of posts 16 relative to a non-structured post surface 17, thereby increasing the likelihood that chiplet 20 will adhere to target substrate 40 or adhesive layer 42 (improving print yields) and reducing the amount of offset shear experienced or needed by chiplet 20 (e.g., the distance chiplet 20 moves with respect to target substrate 40), thereby improving print accuracy. Grooves 18 can be narrower than ridges 19 in a direction orthogonal to ridge direction D. In some embodiments, the area of ridges 19 is greater than the area of grooves 18 (for example much greater, e.g., twice, four times, six time, eight times greater, or more). Consequently, initial adhesion between chiplets 20 and posts 16 when picking chiplets 20 from source wafer 50 is not greatly reduced (since the area of ridges 19 can be only slightly less than the area of post surface 17) and print accuracy and yield are improved.

Thus, according to embodiments of the present disclosure, a stamp 10 for micro-transfer printing can comprise a support 13 having a support surface 15 and posts 16 disposed on support surface 15. Each post 16 comprises a proximal end in contact with support 13 and a distal end extending away from support 13 and support surface 15. The distal end of post 16 can comprise a post surface 17. Post surface 17 can be a structured surface operable to form multiple delamination fronts 30 when (i) a first side of a micro-device 20 (e.g., chiplet 20) is in contact with at least a portion of post surface 17, (ii) a second side of the micro-device 20 (e.g., chiplet 20) opposed to the first side is at least partially in contact with a target surface of a target substrate 40 (or a layer such as adhesive layer 42 disposed on target substrate 40) or another structure having a target surface, and (iii) support 13 is moved at least partially in a horizontal direction 60 parallel to the target surface. The direction of horizontal motion 60 can be orthogonal to a direction of delamination fronts 30 and in a direction of the propagation of delamination fronts 30. The delamination fronts 30 are between chiplets 20 and post surface 17 (a surface of ridges 19). Delamination front 30 can extend in ridge direction D and propagate in a direction orthogonal to direction D or in the direction of horizontal motion 60. Delamination is similar to or the equivalent of peeling post 16 from chiplet 20.

According to some embodiments of the present disclosure, micro-devices 20 (chiplets 20) can be disposed in an upside-down configuration on target substrate 40 with respect to the configuration of chiplets 20 on source wafer 50. Such an upside-down configuration can be implemented by picking up chiplets 20 from source wafer 50 with a first stamp 10A, transferring chiplets 20 from first stamp 10A to a second stamp 10B, and printing chiplets 20 from second stamp 10B to target substrate 40. The transfer of chiplets 20 from first stamp 10A to second stamp 10B is illustrated in the cross section of FIG. 6. The relative motion between first stamp 10A and second stamp 10B can be in a direction that is not parallel to ridge direction D of first stamp 10A, for example orthogonal or diagonal to ridge direction D of first stamp 10A. Thus, adhesion between the first side of chiplets 20 and first stamp 10A can be less than adhesion between the second side of chiplets 20 and second stamp 10B, transferring chiplets 20 from first stamp 10A to second stamp 10B. According to some embodiments, second stamp 10B is similar or identical to first stamp 10A, but is spatially rotated, for example orthogonally, about an axis perpendicular to support surface 15 with respect to first stamp 10A. Moving first stamp 10A in a direction orthogonal to ridge direction D of first stamp 10A relative to second stamp 10B can move second stamp 10B relative to first stamp 10A in a direction parallel to ridge direction D of second stamp 10B. Thus, first stamp 10A can experience multiple delamination fronts 30 (reducing adhesion between chiplet 20 and first stamp 10A posts 16) while second stamp 10B does not experience multiple delamination fronts 30 (and does not experience reduced adhesion between chiplet 20 and second stamp 10B posts 16), thus transferring chiplets 20 from first stamp 10A to second stamp 10B.

Figure 6:
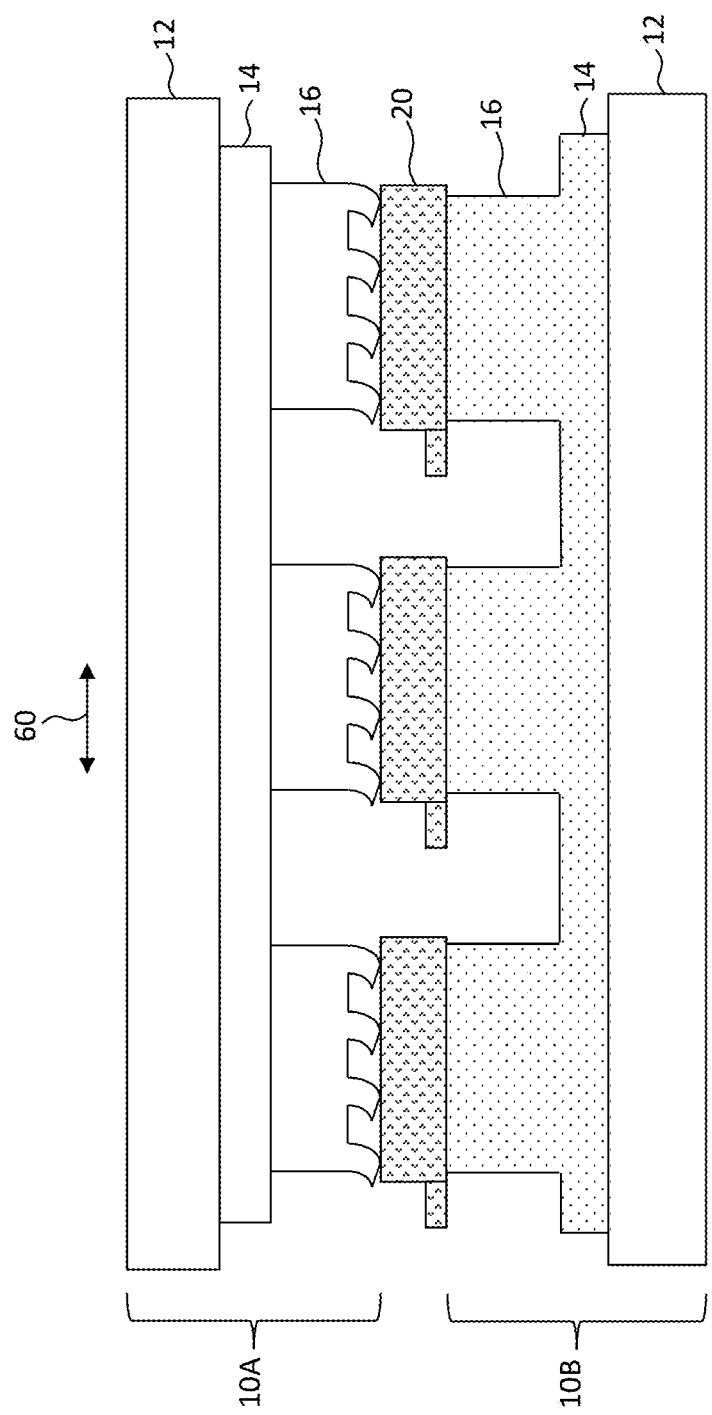
FIG. 6 is a cross section of a first stamp transferring micro-devices to a second stamp according to illustrative embodiments of the present disclosure.
Figure 7:
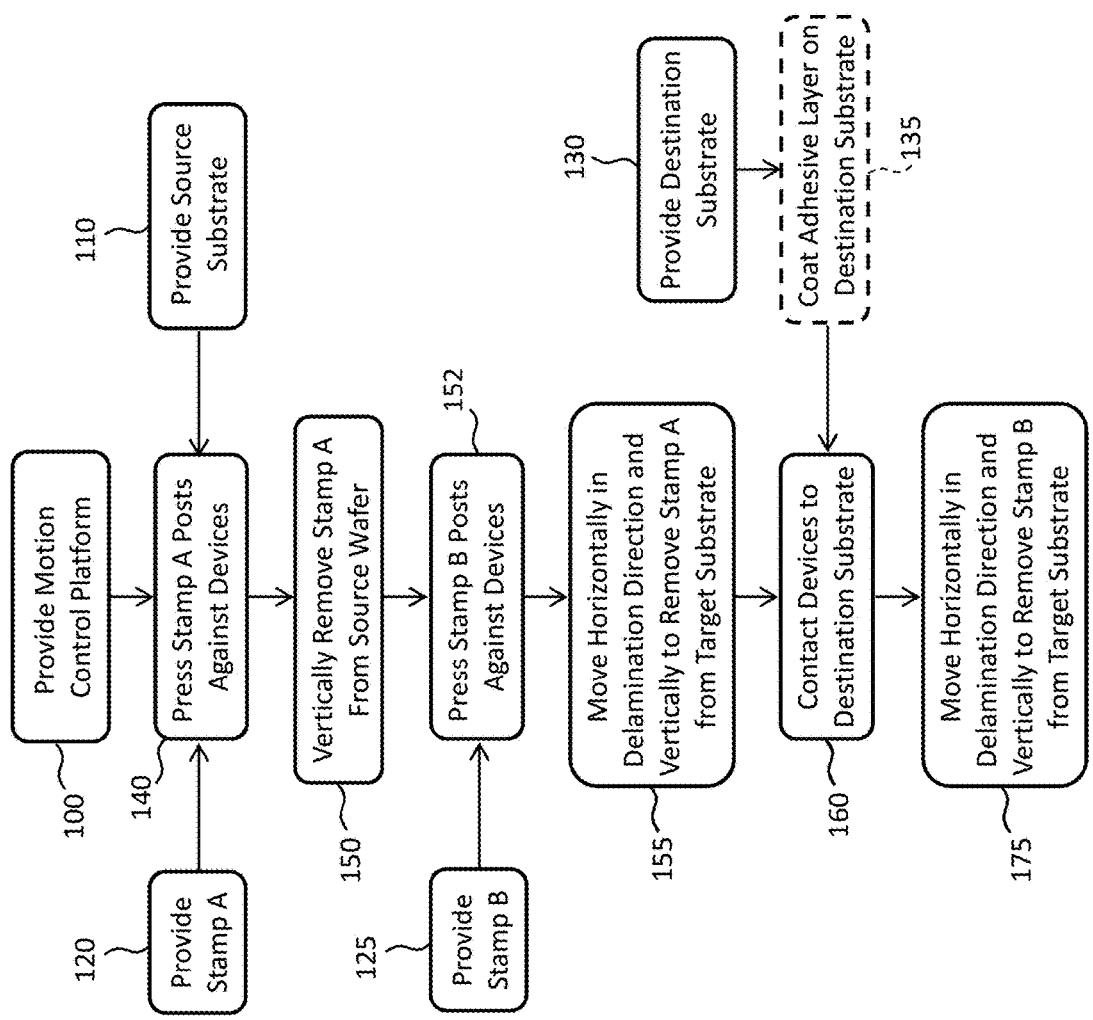
FIG. 7 is a flow diagram of picking up micro-devices from a source wafer with a first stamp, transferring the micro-devices to a second stamp, and printing the micro-devices to a target substrate according to illustrative embodiments of the present disclosure.

FIG. 7 is a flow diagram illustrating the process. According to embodiments of the present disclosure and as illustrated in the successive cross sections of FIGS. 4A-4E, FIG. 6, and the flow diagram of FIG. 7, first and second stamps 10A, 10B can be used for micro-transfer printing chiplets (micro-devices) 20 from a source wafer 50 to a target substrate 40. A motion-control platform 70 is provided in step 100, a chiplet source wafer 50 is provided in step 110, a first stamp 10A is provided in step 120, a second stamp 10B is provided in step 125, and a target substrate 40 is provided in step 130. Chiplet source wafer 50 can comprise a sacrificial layer comprising sacrificial portions 52 separated by anchors 54 attached to chiplets 20 by tethers 22. Chiplets 20 are disposed directly and entirely over sacrificial portions 52. Chiplets 20 are released from source wafer 50 by etching sacrificial portions 52 to form gaps. First stamp 10A comprising rigid substrate 12, optional mesa 14, and posts 16 with a structured post surface 17 comprising ridges 19 spatially separated by grooves 18 is moved by motion-control platform 70 into position in a vertical direction 65 toward and in alignment with source wafer 50 so that the distal end of posts 16 and at least a portion of ridges 19 contact a first side of chiplets 20, temporarily adhering chiplets 20 to posts 16, in step 140 as shown in FIG. 4A. Motion-control platform 70 then removes first stamp 10A from source wafer 50 with chiplets 20 adhered to posts 16 in step 150 by moving first stamp 10A in a vertical direction 65 away from source wafer 50 as shown in FIG. 4B.

In step 152, motion-control platform 70 contacts posts 16 of second stamp 10B to a second side of chiplets 20 opposite the first side. Motion-control platform 70 then horizontally moves first stamp 10A relative to second stamp 10B in a direction non-parallel (e.g., orthogonal or diagonal) to ridge direction D of first stamp 10A, as shown in FIG. 6. At the same time or subsequently, motion-control platform 70 can move first stamp 10A relative to second stamp 10B in a vertical direction 65 to separate first stamp 10A from second stamp 10B in step 155. Because the relative horizontal motion 60 between first stamp 10A and second stamp 10B can form multiple delamination fronts 30 between posts 16 of first stamp 10A, reducing the adhesion of chiplets 20 to posts 16 of first stamp 10A, chiplets 20 can preferentially adhere to posts 16 of second stamp 10B. In some embodiments, second stamp 10B is similar or identical to first stamp 10A (e.g., has a post surface 17 comprising spatially separated ridges 19 that extend entirely across post surface 17) and, during the transfer in step 152 and illustrated in FIG. 6, is rotated (e.g., orthogonally) with respect to first stamp 10A so that, during step 152, post surface 17 of posts 16 of first stamp 10A experience multiple delamination fronts 30 and second post surface 17 of posts 16 of second stamp 10B does not, or at least experiences fewer or smaller delamination fronts 30, so that chiplets 20 can preferentially adhere to posts 16 of second stamp 10B.

In step 160, motion-control platform 70 moves second stamp 10B vertically in direction 65 toward target substrate 40 so that chiplets 20 adhered to posts 16 of second stamp 10B contact target substrate 40. A layer 42 of adhesive can, but is not necessarily, coated in optional step 135 on target substrate 40 before chiplets 20 are contacted to target substrate 40 (or to adhesive layer 42 if present) as shown in FIG. 4C. Motion-control platform 70 can also move second stamp 10B in a horizontal direction 60 (direction X or direction Y or a combination of directions X and Y) parallel to a surface of target substrate 40 in step 160. As used herein, a stamp movement is a relative movement of stamp 10 with respect to a substrate (e.g., target substrate 40 or another stamp) and in some embodiments, the substrate or other stamp is moved instead of stamp 10 in a direction opposite to the direction of stamp movement.

In step 175 and as shown in FIG. 4D, chiplets 20 adhered to target substrate 40 (and optionally adhesive layer 42) are removed from stamp posts 16. Motion-control platform 70 optionally moves second stamp 10B in a horizontal direction 60 parallel to a surface of target substrate 40 and, at the same time, or subsequently, moves second stamp 10B in a vertical direction 65 away from target substrate 40. If second stamp 10B comprises spatially separated ridges 19 on the distal end of posts 16, horizontal stamp motion 60 can be at least partially orthogonal to ridge direction D so that the stress of the relative horizontal motion 60 between chiplets 20 (adhered to target substrate 40 or adhesive layer 42) and posts 16 causes delamination between ridges 19 on the distal end of posts 16, for example on the trailing edge of posts 16 with respect to the relative stamp 10 motion, separating chiplets 20 from posts 16. If second stamp 10B comprises multiple ridges 19 on the distal end of posts 16, the presence of multiple ridges 19 causes multiple delamination fronts 30 to form, decreasing the adhesion between chiplets 20 and the distal end of posts 16. Stamp 10 horizontal and vertical movement in steps 155, 160, and 175 can be, but is not necessarily, continuous and can be separate or combined motions. Stamp 10 horizontal and vertical movement in steps 155 and 175 can be continuous or separate motions and can be combined so that stamp 10 moves both horizontally along and vertically away from target substrate 40 surface at the same time. Similarly, step 160 can comprise both a vertical motion toward and a horizontal motion along the target substrate 40 surface in either continuous or separate movements.

Multiple delamination fronts 30 reduce the adhesion between chiplets 20 and the distal end of posts 16 relative to a non-structured post surface 17, thereby increasing the likelihood that chiplet 20 will adhere to target substrate 40 or adhesive layer 42 (improving print yields) and reducing the amount of offset shear necessary to or experienced by chiplet 20 (e.g., the distance chiplet 20 moves with respect to target substrate 40), thereby improving print accuracy. Grooves 18 can be narrower than ridges 19 in a direction orthogonal to ridge direction D. In some embodiments, the area of ridges 19 is greater than the area of grooves 18 (for example much greater, e.g., twice, four times, six time, eight times greater, or more). Consequently, adhesion between chiplets 20 and posts 16 is not greatly reduced (since the area of ridges 19 is only slightly less than the area of post surface 17) and print accuracy and yield are improved.

Relative motion between a stamp 10 and target substrate 40 (or between a first stamp 10A and second stamp 10B) can form delamination fronts 30 along the trailing edge of each ridge 19, as illustrated in FIGS. 4D and 6. If the relative motion is orthogonal to ridge direction D, the delamination fronts 30 will initially form along a line corresponding to an edge of ridges 19 in contact with chiplets 20. However, if the relative motion has a diagonal component (e.g., neither parallel nor orthogonal to ridge direction D), the greatest trailing edge delamination stress can be at a corner of ridges 19, for example on an edge or side of post 16. Thus, delamination can begin at a corner of ridge 19, theoretically at a point, that has less resistance to delamination because the adhesion at the corner of ridge 19 is much smaller and has a much smaller area (theoretically a point) than the adhesion along the edge of ridges 19 (theoretically a line).

Thus, posts 16 can delaminate from chiplet 20 easier. Therefore, according to embodiments of the present disclosure, relative motion between a stamp 10 and chiplet 20 or target substrate 40 can be in a diagonal, non-perpendicular, and non-parallel direction relative to ridge direction D of stamp 10. The diagonal direction can be, but is not necessarily, at 45 degrees to the ridge direction D.

The use of a diagonal relative motion is generally useful when printing from a stamp 10 having posts 16 with cross sections parallel to support surface 15 that have straight edges and corners (e.g., a rectangular cross section) where the diagonal motion is diagonal with respect to an edge (or side) of post surface 17. In such embodiments, posts 16 of stamps 10 are peeled from a corner of post 16 to detach chiplets 20 from posts 16. Thus, according to embodiments of the present disclosure, a method of micro-transfer printing comprises providing a stamp 10 comprising a support 13 having a support surface 15 and posts 16 disposed on support surface 15, providing a target substrate 40 having a target substrate surface, and providing a motion-control platform 70 attached to stamp 10. Each post 16 comprises a proximal end in contact with support 13 and a distal end extending away from support 13. Post 16 has a post surface 17 on the distal end of post 16 having edges and corners. A micro-device 20 (e.g., a chiplet 20) is temporarily adhered to each post surface 17. Motion-control platform 70 contacts micro-devices 20 to the target substrate surface. Contacting the micro-devices 20 to the target substrate surface comprises moving micro-devices 20 toward and in contact with the target substrate surface, moving micro-devices 20 in a direction parallel to the target substrate surface at least partially in a direction non-parallel to an edge (e.g., diagonally), and moving stamp 10 away from target substrate 40. Moving stamp 10 away from target substrate 40 can be done at the same time as or subsequent to moving the micro-devices 20 in a direction parallel to the target substrate surface at least partially in a direction non-parallel to an edge. Where stamp 10 comprises posts 16 with structured post surface 17 having spatially separated ridges 19, the direction parallel to the target substrate surface can be orthogonal, diagonal (e.g., at 45 degrees) to ridge direction D.

Separation between posts 16 and chiplets 20 is achieved with less force where delamination fronts 30 can propagate from a corner of post surface 17 or corners of ridges 19 by moving stamp 10 diagonally with respect to an edge of post surface 17 or ridge direction D compared to moving stamp 10 orthogonally to the edge of post surface 17 or ridge direction D. Similarly, separation between posts 16 and chiplets 20 is achieved with less force and in less distance where multiple delamination fronts 30 can propagate from an edge of post surface 17 or edges of ridges 19 by moving stamp 10 orthogonally with respect to an edge of post surface 17 or ridge direction D compared to moving stamp 10 vertically (in vertical direction 65) away from target substrate 40.

Embodiments of the present disclosure have been constructed and demonstrated to micro-transfer print chiplets 20 onto a substrate both without an adhesive layer and with an adhesive layer, for example a 30-60 nm adhesive layer on the substrate.

According to some embodiments, if post 16 has a cross section parallel to support surface 15 that has a point or a shorter trailing edge with respect to a direction of stamp movement, the point or shorter edge can delaminate easier, reducing the force needed to remove stamp 10 from chiplets 20. As shown in FIGS. 8A-8E, posts 16 can have a cross section parallel to support surface 15 that has first and second edges (sides or ends) 80, 82 in a horizontal stamp motion 60 (delamination direction 60). First edge 80 is the leading edge and second edge 82 is the trailing edge of horizontal stamp motion 60 relative to a chiplet 20 or target substrate 40. As shown, first edge 80 is longer than second edge 82. Second edge 82 can be a point. Thus, the trailing edge (second edge 82) is shorter than the leading edge (first edge 80) so that delamination occurs with less force. FIG. 8A is a perspective illustrating stamp 10 with posts 16 that has a second edge 82 that is a point. FIG. 8B is a plan view of a post 16 with post surface 17 having a shorter edge, FIG. 8C has a point at trailing second edge 82 (corresponding to FIG. 8A), FIG. 8D is a plan view of a post 16 with a trailing second edge 82 forming a trapezoidal post surface 17, and FIG. 8E is a plan view of a post 16 with a trailing second edge 82 forming a point of a triangular trapezoidal post surface 17.

Thus, according to embodiments of the present disclosure, a stamp 10 for micro-transfer printing can comprise a support 13 having a support surface 15 and posts 16 disposed on support surface 15. Each post 16 comprises a proximal end in contact with support 13 and a distal end extending away from support 13 and has a post surface 17 on the distal end. Post surface 17 (e.g., a cross section of post 16 in a direction parallel to support surface 15) is non-rectangular and has opposing edges or sides with different lengths. Post surface 17 can be triangular or trapezoidal, can have an edge or a side that is triangular or trapezoidal, or can come to a point or corner. A point or corner can be considered to have a length of zero and therefore a post surface 17 with a point on a second edge or side 82 opposing a first edge or side 80 has a different length than the first edge or side 80. A length of the trailing second edge 82 can be shorter or less than the length of the leading first edge 80.

Non-rectangular post surface 17 shapes as shown in FIGS. 8A-8E can be ridges 19 in stamps 10 according to embodiments of the present disclosure. FIG. 9A is a plan view and FIG. 9B a corresponding cross section taken along cross section line A of FIG. 9A of post 16 having spatially separated non-rectangular ridges 19 with opposing sides (e.g., first edge or side 80 and second edge or side 82) having different lengths separated by grooves 18.

FIGS. 10A and 10B are plan views illustrating delamination corners 84 for posts 16 moved in a diagonal delamination direction 60 for a post 16 with rectangular ridges 19 (as shown in FIG. 10A) and a post 16 with non-rectangular ridges 19 (as shown in FIG. 10B). FIG. 10C illustrates diagonal delamination for post 16 with a single rectangular post surface 17. As stamp 10 and post 16 move in delamination direction 60, post 16 can delaminate from chiplets 20 starting at delamination corners 84 and progressing in delamination direction 60 with delamination fronts 30 orthogonal to delamination direction 60.

According to some embodiments of the present disclosure, a method of making a stamp 10 for micro-transfer printing comprises providing a mold defining mesa 14 and one or more posts 16 disposed on and in direct contact with mesa 14 that extend away from mesa 14, providing a rigid support 12 in or in contact with the mold, providing liquid curable stamp material in the mold (e.g., by injecting at approximately 25 psi pressure), curing the curable stamp material at a cure temperature (e.g., at approximately 60° C. for approximately 240 minutes in an oven) to form cured stamp material, and cooling rigid support 12 and cured stamp material to an operating temperature different from the cure temperature. In some embodiments, methods of the present disclosure comprise removing the mold to provide a stamp 10 for micro-transfer printing. Posts 16 can be disposed in a regular array over rigid support 12 and mesa 14 and posts 16 extending away from mesa 14 and rigid support 12 can be collectively disposed in a regular array over mesa 14 and rigid support 12. Rigid support 12 can have a coefficient of thermal expansion (CTE) that is greater than a post 16 or mesa 14 material CTE. Mesa 14 and posts 16 can comprise a common material (e.g., PDMS). Rigid substrate can be glass. Molds can be silicon masters formed in a silicon substrate (wafer) using photolithographic methods and materials.

The present disclosure provides structures and methods that facilitate micro-transfer printing of micro-devices (chiplets) 20 on a source wafer 50 (e.g., as shown in FIG. 4A), especially substrates such with an extensive surface as an integrated circuit wafer. Micro-devices 20 are formed on a source wafer 50, each micro-device 20 is contacted by a different post 16 of a stamp 10 under the control of a motion-control platform 70 to release micro-devices 20 from source wafer 50 and adhere micro-devices 20 to posts 16 of stamp 10, and micro-devices 20 are pressed against a target substrate 40 to adhere micro-devices 20 to target substrate 40, forming a micro-transfer printed system. Stamp 10 is then moved away from target substrate 40, leaving micro-devices 20 on target substrate 40. Different stamp steps can be applied to micro-devices 20 from different source wafers 50, for example thereby forming a heterogeneous micro-system on target substrate 40 comprising a variety of different micro-devices 20 constructed in different materials, for example silicon and various compound semiconductors such as GaN or GaAs.

Micro-transfer printable micro-devices 20 can have, for example, one or more of a width from 1-8 µm, a length from 5-10 µm, or a height from 0.5-3 µm. More generally, micro-transfer printable micro-devices 20 can comprise or be a variety of chiplets 20 comprising conductor or semi-conductor structures, including, but not limited to, active components such as any one or more of a diode, a light-emitting diode (LED), a transistor, a laser, an integrated circuit, and active electrical components, or passive electrical components such as any one or more of resistors, capacitors, conductors, and electrical jumpers. Micro-transfer printable micro-device 20 can be an unpackaged die. In some embodiments, micro-transfer printable micro-device 20 is a compound element having a plurality of active or passive elements, such as multiple semiconductor micro-devices 20 with separate substrates, each with one or more active elements or passive elements, or both. In certain embodiments, the plurality of elements is disposed and interconnected on a compound element substrate separate from the substrates of any semiconductor micro-devices 20 or a different substrate. The compound element can be a micro-device 20 and can be micro-transfer printed itself after the elements have been arranged and interconnected thereon. The micro-transfer printable micro-device 20 can be electronic processors, controllers, drivers, light-emitting diodes, photodiodes, light-control micro-devices 20, or light-management micro-devices 20.

Micro-transfer printing enables printed structures with low-cost, high-performance heterogeneous arrays of electrically connected micro-devices 20 such as integrated circuits, photonic elements such as lasers, sensor, or light pipes, or micro-light-emitting diodes (LEDs) useful, for example, in display or photonic systems. Micro-transfer printable micro-devices 20 can be light emitters or integrated circuits, for example CMOS integrated circuits made on or in a silicon source wafer 50, light-emitting diodes (LEDs) or lasers, for example made on or in a GaN, GaAs, or InP compound semiconductor source wafer 50, or silicon photodiodes. For example, described herein are micro-assembled heterogeneous arrays of micro-devices 20, such as integrated circuits, lasers, or micro-LEDs, that are too small, numerous, or fragile to be assembled by conventional means. Rather, these arrays are assembled using micro-transfer printing technology.

Components 20 (e.g., micro-devices 20) may be prepared on a native source wafer 50 and printed to a target substrate 40 (e.g., plastic, metal, glass, ceramic, sapphire, transparent materials, opaque materials, rigid materials, or flexible materials), thereby obviating the manufacture of micro-devices 20 on target substrate 40. Source wafers 50 can have a dimension (e.g., a diameter) no less than 25 mm (e.g., no less than 51 mm, no less than 76 mm, no less than 10 mm, no less than 150 mm, no less than 200 mm, no less than 300 mm, no less than 450 mm, or no less than 675 mm, e.g., a 2-inch, 4-inch, 8-inch, or 12-inch wafer).

Chiplets 20 are small integrated circuits. Chiplets 20 can be unpackaged dies released from a source wafer 50 and can be micro-transfer printed and incorporate a broken (e.g., fractured) or separated chiplet tether 22. Components (e.g., chiplets 20, such as micro-devices 20) can have at least one of a width, a length, and a height of, for example, from 2 µm to 1 mm (e.g., 2 to 5 µm, 5 to 10 µm, 10 to 20 µm, 20 to 50 µm, 50 µm to 100 µm, 100 µm to 250 µm, 250 µm to 500 µm, or 500 µm to 1000 µm). Chiplets 20 can, for example, have a doped or undoped semiconductor substrate thickness of 2 to 5 µm, 5 to 10 µm, 10 to 20 µm, or 20 to 50 µm. Chiplets 20 or micro-transfer printable micro-devices 20 can have a length greater than width, for example having an aspect ratio greater than or equal to 2, 4, 8, 10, 20, or 50 and component contact pads that are adjacent to the ends of micro-transfer-printable micro-devices 20 along the length of micro-transfer-printable micro-devices 20.

Components 20 can be any of a wide variety of devices, such as, for example but not limited to, electronic, optical, optoelectronic, mechanical, or piezoelectric devices. Components 20 can be optically emissive or responsive and can be light emitters (such as LEDs), light sensors (such as photodiodes), lasers, or electrical jumpers. Components 20 can be integrated circuits (for example CMOS, bipolar, or mixed circuits) and comprise electronically active or passive electronic elements or both. Components 20 can be constructed using photolithographic methods and materials. Components 20 can have, for example, at least one of a width, length, and height from 2 µm to 1000 µm (for example 2 to 5 µm, 5 to 10 µm, 10 to 20 µm, 20 to 50 µm, 50 µm to 100 µm, 100 µm to 250 µm, 250 µm to 500 µm, or 500 µm to 1000 µm). Components 20, for example, can have a substrate thickness from 2 µm to 50 µm (for example from 2 to 5 µm, 5 to 10 µm, 10 to 20 µm, or 20 to 50 µm). Components 20 can have a length greater than width, for example having an aspect ratio greater than or equal to 2 (for example greater than or equal to 4, 8, 10, 20, or 50).

A component 20 can be an active circuit component, for example including one or more active electronic components such as electronic transistors or diodes or light-emitting diodes or photodiodes that produce an electrical current in response to ambient light. A component 20 can be a passive component, for example including one or more passive elements such as resistors, capacitors, or conductors. In some embodiments, a component 20 includes both active and passive elements. A component 20 can be a semiconductor device having one or more semiconductor layers, such as an integrated circuit. A component 20 can be an unpackaged die. In some embodiments, a component 20 is a compound device 20 having a plurality of active or passive elements, such as multiple semiconductor components with separate substrates, each with one or more active elements or passive elements, or both. Components 20 can be or include, for example, electronic processors, controllers, drivers, light-emitting diodes, photodiodes, light-control devices, light-management devices, piezoelectric devices, acoustic wave devices (e.g., acoustic wave filters), optoelectronic devices, electromechanical devices (e.g., microelectromechanical devices), photovoltaic devices, sensor devices, photonic devices, magnetic devices (e.g., memory devices), or elements thereof.

In certain embodiments, formation of a printable micro-device 20 begins while the semiconductor structure remains on a substrate, such as a sapphire substrate. After partially forming printable micro-device 20, a handle substrate is attached to the system opposite the substrate such that the system is secured to the handle substrate. The substrate, such as the sapphire substrate, may then be removed from the system using various techniques, such as laser ablation, grinding, etching, and polishing. After the substrate is removed, formation of the semiconductor structure is completed to form printable micro-device 20. Upon completion, printable micro-device 20 may be micro-transfer printed to a target substrate 40, thereby enabling parallel assembly of high-performance semiconductor micro-devices 20 (e.g., to form micro-LED displays or photonic systems) onto virtually any substrate material, including glass, plastics, metals, other semiconductor materials, or other non-semiconductor materials.

Micro-structured stamps 10 (e.g., elastomeric, electrostatic stamps, or hybrid elastomeric/electrostatic stamps) can be used to pick up the disclosed micro-devices 20, transport micro-devices 20 to a destination, and print micro-devices 20 onto a target substrate 40. In some embodiments, surface adhesion forces are used to control the selection and printing of these micro-devices 20 onto destination substrate 40. This process may be performed massively in parallel. Stamps 10 can be designed to transfer a single micro-device 20 or hundreds to thousands of discrete structures in a single pick-up and print operation. For a discussion of micro-transfer printing generally, see U.S. Pat. Nos. 7,622,367 and 8,506,867, each of which is hereby incorporated by reference in its entirety. Moreover, these micro-transfer printing techniques can be used to print semiconductor micro-devices 20 at temperatures compatible with assembly on plastic polymer substrates (e.g., target substrates 40). In addition, semiconductor materials may be printed onto large areas of target substrates 40 thereby enabling continuous, high-speed printing of micro-devices 20.

Posts 16 extend from mesa 14 in a direction away from mesa 14 and away from rigid substrate 12. Stamp posts 16 can have, for example, a length ranging from 5 µm to 100 µm (e.g., 20 µm). Posts 16 can have an aspect ratio (height-to-width) of, for example from 1:4 to 4:1. Posts 16 can have a size that is larger or smaller than the size of a micro-device 20 that posts 16 are designed to contact. Each post 16 is designed to contact a single different micro-device 20 so that each stamp post 16 contacts only one micro-device 20 and each micro-device 20 is contacted by only one stamp post 16. For example, posts 16 can have a length extending from mesa 14 that is no greater than 200 µm (e.g., no greater than 100 µm, no greater than 50 µm, no greater than 20 µm, no greater than 10 µm, no greater than 5 µm, no greater than 3 µm, no greater than 2 µm, no greater than 1 µm, or no greater than 0.5 µm). These ranges and values are illustrative and not limiting and other materials and sizes are contemplated in the present disclosure. Additionally, posts 16 can have a shape that is the same as or different from the shape of micro-device 20 that is picked up by stamp 10. For example, in an embodiment a circular post 16 is used to pick up an 85 µm square chiplet 20. In some embodiments, for example, a 60 µm square post 16 is used to pick up an 85 µm square micro-device 20.

In some embodiments, mesa 14 can have a range of thickness from 100 µm to 10 mm. Mesas 14 or posts 16 of the present disclosure can comprise or be made of conformal materials such as a visco-elastic material or an elastomer, for example polydimethylsiloxane (PDMS), an optically clear polymeric organosilicon compound. The stiffness and CTE of PDMS can be controlled by forming PDMS with different ratios of constituents. For example, Dow Sylgard 184 Elastomer Base and Curing Agent by Dow Corning Corporation of Auburn, MI, can be mixed at a ratio from 1 part elastomer base to 1 part curing agent by weight to 50 parts elastomer base to 1 part curing agent by weight (e.g., ten parts elastomer base to one part curing agent by weight) to provide PDMS with varying stiffness and CTE.

Mesas 14 and posts 16 can be formed from a mixture having a ratio of elastomer to curing agent in a range of 1:1 to 15:1, for example made in a ratio of about 10:1 elastomer to curing agent (e.g., varying no more than 10% from a ratio of 10:1). In some embodiments, mesa 14 is made of the same material in the same proportions as posts 16 and have the same stiffness and CTE. Alternatively, mesa 14 includes the same material as posts 16 but in different proportions or includes different materials. Using the same materials in different proportions in mesa 14 and posts 16 enables the stiffness and CTEs of the different layers to be separately controlled. For example, in some embodiments, mesa 14 is stiffer than posts 16 or has a smaller CTE than posts 16. Thus, in some embodiments, mesa 14 is more rigid than posts 16 and the mesa CTE is smaller than the post CTE. For example, mesa 14 can be made with a ratio of 2:1 to 8:1 elastomer to curing agent, for example about 5:1, and posts 16 can be made in a ratio of 8:1 to 14:1 elastomer to curing agent, for example about 10:1.

According to some embodiments of the present disclosure, rigid support 12 has a dimension (e.g., diameter, length, or width) no less than 25 mm (e.g., no less than 50 mm, no less than 100 mm, no less than 150 mm, no less than 200 mm, no less than 300 mm, no less than 450 mm, or no greater than 675 mm) or a thickness no less than 0.5 mm (e.g., no less than 0.75 mm, no less than 1 mm, no less than 2, no less than 5 mm, or no less than 10 mm). These ranges are illustrative and not limiting and other materials and sizes are contemplated in the present disclosure. According to some embodiments of the present disclosure, rigid support 12 can be or comprise glass (e.g., a portion of a flat-panel display substrate), soda-lime glass, borosilicate glass, quartz, sapphire, pyrex, metal, ceramic, polymer, a cured epoxy, or a semiconductor (e.g., a wafer or portion of a wafer). Rigid support 12 can be made from, for example, glass or plastic (e.g., polycarbonate (PC), poly(methyl methacrylate) (PMMA), polyethylene terephthalate (PET), or polyethylene naphthalate (PEN)). Rigid support 12 can be thicker, the same thickness as, or thinner than mesa 14. Rigid support 12 can be, for example, no less than 500 microns thick (for example no less than 700 microns, 1 mm, 2 mm, 3 mm, 5 mm, or 1 cm thick). The linear CTE can be from $5 \times 10^{-6}$/K to $10 \times 10^{-6}$/K (e.g., approximately $8.5 \times 10^{-6}$/K).

The micro-transfer printable micro-devices 20 can include active elements such as electronic circuits formed using lithographic processes and can include passive elements such as electrical connections, e.g., wires. In some embodiments, micro-transfer printable micro-devices 20 are small integrated circuits, for example chiplets 20, having a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such chiplet 20 printable component structures can be made in a semiconductor source wafer 50 (e.g., a silicon or GaN wafer) having a process side and a back side used to handle and transport source wafer 50. Micro-transfer printable micro-devices 20 are formed using lithographic processes in an active layer on or in the process side of source wafer 50. An empty release layer space (e.g., sacrificial portion 52) is formed beneath micro-transfer printable micro-devices 20 with tethers 22 connecting micro-transfer printable micro-devices 20 to source wafer 50 in such a way that pressure applied against micro-transfer printable micro-devices 20 breaks (e.g., fractures) or separates tethers 22 to release micro-transfer printable micro-device 20 from source wafer 50 (e.g., with stamp 10). Methods of forming such structures are described, for example, in Cok et al., "AMOLED Displays using Transfer-Printed Integrated Circuits," Society for Information Display, Vol. 40, Issue 1, pp. 947-950, and U.S. Pat. No. 8,889,485, entitled Methods of Surface Attachment of Flipped Active Components, issued Nov. 18, 2014.

According to various embodiments, a native source wafer 50 can be provided with micro-transfer printable micro-devices 20, release layer (e.g., sacrificial portion 52), and tethers 22 already formed, or they can be constructed as part of a process of the present disclosure.

Source wafer 50 and micro-transfer printable micro-device 20, stamp 10, motion-control platform 70, and target substrate 40 can be made separately and at different times or in different temporal orders or locations and provided in various process states.

Methods, in some embodiments, can be iteratively applied to a single or multiple target substrates 40. By repeatedly transferring sub-arrays of micro-transfer printable micro-device 20 from a source wafer 50 to a target substrate 40 with a stamp 10 and relatively moving stamp 10 and target substrate 40 between stamping operations by a distance equal to the spacing of the selected micro-transfer printable micro-devices 20 in the transferred sub-array between each transfer of micro-transfer printable micro-device 20, an array of micro-transfer printable micro-device 20 formed at a high density on a source wafer 50 can be transferred to a target substrate 40 at a much lower density. In practice, source wafer 50 is likely to be expensive, and forming micro-transfer printable micro-devices 20 with a high density on source wafer 50 will reduce the cost of micro-transfer printable micro-devices 20, especially as compared to forming components on target substrate 40. Transferring micro-transfer printable micro-device 20 to a lower-density target substrate 40 can be used, for example, if micro-transfer printable micro-devices 20 manage elements distributed over target substrate 40, for example in a display, digital radiographic plate, or photovoltaic system.

In particular, in the case wherein active micro-transfer printable micro-device 20 is an integrated circuit formed in a crystalline semiconductor material, the integrated circuit substrate provides sufficient cohesion, strength, and flexibility that it can adhere to target substrate 40 without breaking as transfer stamp 10 is removed.

In comparison to thin-film manufacturing methods, using densely populated source wafers 50 and transferring micro-transfer printable micro-devices 20 to a target substrate 40 that requires only a sparse array of micro-transfer printable micro-devices 20 located thereon does not waste or require active layer material on a target substrate 40. The present invention can also be used in transferring micro-transfer printable micro-devices 20 made with crystalline semiconductor materials that have higher performance than thin-film active components. Furthermore, the flatness, smoothness, chemical stability, and heat stability requirements for a target substrate 40 used in certain embodiments of the present disclosure may be reduced because the adhesion and transfer process is not substantially limited by the material properties of the target substrate 40. Manufacturing and material costs may be reduced because of high utilization rates of more expensive materials (e.g., the source wafer 50) and reduced material and processing requirements for target substrate 40.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously.

PARTS LIST

A cross section line
B cross section line
D ridge direction
X x dimension/x direction
Y y dimension/y direction
Z z dimension/z direction
10 stamp
10A first stamp
10B second stamp
12 rigid support
13 support
14 mesa/pedestal
15 support surface
16 post
17 post surface
18 groove
19 ridge
20 chiplet/micro-device/component
22 chiplet tether
30 delamination front
40 target (destination) substrate
42 optional adhesive layer
50 source wafer 52 sacrificial portion/gap
54 anchor
60 horizontal direction/horizontal stamp motion/delamination direction
65 vertical stamp motion
70 motion-control platform
80 first edge
82 second edge
84 delamination corner
100 provide motion-control platform step
110 provide source wafer step
120 provide stamp step/provide stamp A step
125 provide stamp B step
130 provide target substrate step
135 optional coat adhesive layer on destination substrate step
140 press stamp posts against micro-devices step
150 vertically remove stamp A from source wafer step
152 press stamp B posts against micro-devices
155 move horizontally in delamination direction and vertically to remove stamp A from micro-devices step
160 contact micro-devices to destination substrate
170 move horizontally in delamination direction and vertically to remove stamp from destination substrate step
175 move horizontally in delamination direction and vertically to remove stamp B from destination substrate step

What is claimed:

1. A system for micro-transfer printing, the system comprising:
a motion-control platform;
a stamp comprising
a support having a support surface, and
posts disposed on the support surface, each of the posts comprising a distal end extending away from the support, the post having a post surface on the distal end, wherein the post surface is a structured surface comprising spatially separated ridges that extend in a ridge direction entirely across the post surface; and
components on a component source wafer, each of the components disposed on the source wafer to contact one of the posts such that the spatially separated ridges of the post surface are in contact with the component,
wherein the motion-control platform is operable to move the stamp to adhere the ridges of the posts to the components and to move the stamp horizontally in a direction at least partially orthogonal to the ridge direction, thereby delaminating the ridges from the components during printing of the components to a target substrate.

2. The system of claim 1, wherein the ridges are separated by grooves that extend in the ridge direction entirely across the post surface.

3. The system of claim 2, wherein the grooves have a rectangular cross section in a direction that is orthogonal to the ridge direction and to the support surface.

4. The system of claim 2, wherein the grooves have a triangular cross section in a direction that is orthogonal to the ridge direction and to the support surface.

5. The system of claim 1, wherein the ridges have a rectangular or trapezoidal cross section in a direction that is orthogonal to the ridge direction and to the support surface.

6. The system of claim 1, wherein the ridges have a triangular cross section in a direction that is orthogonal to the ridge direction and to the support surface.

7. The system of claim 1, wherein each of the ridges has a same shape.

8. The system of claim 1, wherein some of the ridges have a shape different from others of the ridges.

9. The system of claim 1, wherein a surface of the ridges has a rectangular shape or forms a line.

10. The system of claim 1, wherein the ridges have a first end and an opposing second end in a direction that is orthogonal to the ridge direction and parallel to the support surface, and the first end has a length that is different from a length of the second end.

11. The system of claim 1, wherein the support and the posts comprise a polydimethylsiloxane.

12. The system of claim 1, wherein at least a portion of the support and the posts are a common structure comprising a common material.

13. A method of micro-transfer printing, comprising:
providing a stamp, a source wafer comprising components disposed in an arrangement corresponding to an arrangement of the posts, and a target substrate, wherein the stamp comprises (i) a support having a support surface, and (ii) posts disposed on the support surface, each of the posts comprising a distal end extending away from the support, the post having a post surface on the distal end, wherein the post surface is a structured surface comprising spatially separated ridges that extend in a ridge direction entirely across the post surface;
contacting the ridges of the posts to the components;
removing the components from the source wafer, and contacting the components to a substrate surface of the target substrate,
wherein contacting the components to the substrate surface comprises moving the components toward and in contact with the target substrate, moving the components in a direction parallel to the substrate surface and in a direction at least partially orthogonal to the ridge direction while the components are in contact with the target substrate, and moving the stamp away from the target substrate.

14. A stamp for micro-transfer printing, the stamp comprising:
a support having a support surface;
posts disposed on the support surface, each of the posts comprising a distal end extending in a vertical direction away from the support, the post having a post surface on the distal end; and
a micro-device that is an unpackaged die adhered to the ridges; and
wherein the post surface is a structured surface comprising ridges spatially separated by grooves that extend in a ridge direction entirely across the post surface,
wherein (i) the posts are operable to adhere components to the ridges and (ii) the support is operable to move the posts in a horizontal direction orthogonal to the vertical direction and in a direction at least partially orthogonal to the ridge direction.

15. The stamp of claim 14, wherein the micro-device comprises an integrated circuit, an active component, a passive component, an electronic component, an optical component, an opto-electronic component, a mechanical component, a seed crystal, a piezoelectric material or device, a light-emitting diode, a transistor, laser, a mechanical device, a photovoltaic device, a sensor device, a photonic device, or a magnetic device.

16. The stamp of claim 14, wherein the micro-device is partially delaminated from the top surface of the ridges.

17. The stamp of claim 14, wherein the micro-device comprises at least a portion of a tether.

18. The stamp of claim 14, comprising a rigid substrate and wherein the support is a mesa disposed on the rigid substrate.

19. The stamp of claim 14, wherein the posts are disposed in a two-dimensional array.

20. The stamp of claim 14, wherein the grooves are narrower than the ridge.

21. The stamp of claim 14, wherein the ridges are separated by grooves that extend in the ridge direction entirely across the post surface and the micro-device is not in contact with the grooves.

* * * * *